(12) United States Patent
Ing et al.

(10) Patent No.: US 8,110,839 B2
(45) Date of Patent: Feb. 7, 2012

(54) LIGHTING DEVICE, DISPLAY, AND METHOD FOR MANUFACTURING THE SAME

(75) Inventors: Wen-Chiun Ing, Xindian (TW); Wei-Hsin Hou, Taipei (TW)

(73) Assignee: Luxingtek, Ltd., Taipei (TW)

( * ) Notice: Subject to any disclaimer, the term of this patent is extended or adjusted under 35 U.S.C. 154(b) by 278 days.

(21) Appl. No.: 12/501,592

(22) Filed: Jul. 13, 2009

(65) Prior Publication Data

US 2011/0006316 A1    Jan. 13, 2011

(51) Int. Cl.
*H01L 33/00* (2010.01)
*H01L 21/00* (2010.01)
(52) U.S. Cl. ............... 257/89; 257/E33.067; 438/27
(58) Field of Classification Search ............ 257/89, 257/E33.067; 438/27
See application file for complete search history.

(56) References Cited

U.S. PATENT DOCUMENTS

| | | | |
|---|---|---|---|
| 7,518,155 | B2 | 4/2009 | Ishidu et al. |
| 2007/0090387 | A1* | 4/2007 | Daniels et al. ............ 257/99 |
| 2008/0084150 | A1* | 4/2008 | Cok ........................ 313/110 |
| 2009/0121249 | A1 | 5/2009 | Tseng et al. |
| 2009/0272996 | A1* | 11/2009 | Chakraborty ............. 257/98 |
| 2010/0127283 | A1* | 5/2010 | van de Ven et al. ........ 257/89 |

FOREIGN PATENT DOCUMENTS

| | | |
|---|---|---|
| CN | 1585141 A | 2/2005 |
| CN | 1833322 A | 9/2006 |
| CN | 201246632 Y | 5/2009 |

* cited by examiner

*Primary Examiner* — Lex Malsawma
(74) *Attorney, Agent, or Firm* — Patterson Thuente Christensen Pedersen, P.A.

(57) ABSTRACT

A display, a lighting device and a method for manufacturing the lighting device are provided. The lighting device comprises a substrate, an electrode layer, a plurality of light source units and a light scattering layer, which is covered by a transparent layer and a reflector layer to create a uniform surface light within an ultra thin format. A yellow phosphor layer is disposed above the reflector layer to create white light when a blue LED or UV LED is used. The lighting device also provides a unique electrode layout design which can be applied for local dimming control and can be easily applied for large size product applications.

24 Claims, 36 Drawing Sheets

LIGHTING DEVICE, DISPLAY, AND METHOD FOR MANUFACTURING THE SAME

CROSS-REFERENCES TO RELATED APPLICATIONS

Not applicable.

BACKGROUND OF THE INVENTION

1. Field of the Invention

The present invention relates to a novel lighting device being able to produce a uniform surface light with an ultra thin format and a method for manufacturing the lighting device.

2. Descriptions of the Related Art

Typical LED packaging comprises attaching an LED die onto a lead frame made of injected aluminum piece, wire bonding to electrically connect LED to the lead frame, and encapsulating the LED, wire bonds and lead frame with an optical clear epoxy using a molding process, where two leads come out of the molded encapsulant for electrical connection. This type of LED packaging structure produces a "dot" light source and is widely adapted for general lighting, message board and light box. Another type of LED packaging, where the LED is packaged into a very compact format used for SMT assembly, is widely used for LCD backlight unit applications. However, it is well known in the field that these typical LED packaging are costly (as compared to a LED bare die) and cannot be used to create an uniform surface light without a sophisticated optical design and costly manufacturing processes. Taking an LCD device for example, the LCD device comprises key components such as the liquid crystal panel, TFT backplane and backlight module. The individual pixels on the liquid crystal panel are controlled by the TFT backplane to allow the light to pass through to determine the bright or dark state of each pixel under the illumination of light emitted from the backlight module. Due to the trend of thinner displays, the thickness and the cost of backlight modules turn into the main technical point in this field.

There are various kinds of light sources being used in the backlight module, for example, cold cathode fluorescent light (CCFL), electroluminescent (EL), light emitting diode (LED), organic LED (OLED), polymer LED (PLED). In consideration of cost and maturity, an LED array formed by a plurality of light-emitting diodes (LEDs) is commonly used as a light source of a backlight module. Generally, the backlight module can be categorized into: a direct-type backlight module and an edge-type backlight module.

The edge-type backlight modules are widely adopted in LCDs featuring a thin format. The edge-type backlight module comprises a light guide plate and the LEDs are disposed along the peripheral of the light guide plate, where the LED light traveling into the light guide plate and to light up the display. However, it is know in the field that a large-scale light guide plate faces manufacturing difficulty and is costly to be utilized in a large-scale display. Moreover, because light emitted from each LED spreads out through the entire light guide plate, no regional on/off control can be established. Therefore the edge-type backlight module cannot be used for LCD requiring local dimming features.

The conventional direct-type backlight module used for a display directly has the LEDs disposed under the display panel. To enhance the uniformity, a diffuser which is disposed in front of the LEDs is needed. In spite of the direct-type backlight module being suitable for the large-scale displays, it can be well imagined that the direct-type backlight module is not only too complicated to arrange the light sources onto the bezel but also too thick since the diffuser for scattering light has to be spaced apart from the LEDs. In other words, the direct-type backlight module faces a dilemma to provide a uniform brightness or to a thinner appearance.

Given the above, a novel lighting device for large size product manufacturing, ultra-thin format, and uniform surface light and local dimming features needs to be developed for LCD backlight module application.

SUMMARY OF THE INVENTION

The primary objective of this invention is to provide a novel lighting device, a display, and a method for manufacturing the lighting device. The lighting device comprises a plurality of light source units being disposed on the substrate and electrically connecting with a patterned electrode layer. The light source units can be selectively activated through the electrode layer to turn on and off within a regional area.

This invention provide a novel LED packaging structure which not only can produce an uniform surface light under an ultra thin format, but also be able to be manufactured by adapting traditional PCB assembly methods and high throughput coating processes. The novel LED packaging structure as disclosed in this invention can be used for various product applications including LCD backlight module, POP signs, decorative lighting, light boxes, . . . , etc, where an ultra thin format is strongly desired.

More specifically, the light source units are manufactured by bonding LED bare dice directly onto a print circuit board (PCB) in a highly compacted format and then cutting the PCB to obtain a great quantity of light source units. Then, the light source units can be arranged onto the substrate for large size product applications.

Yet another objective of this invention is to provide a novel lighting device and a method for manufacturing the lighting device, where the reflector for forming inner reflections is adopted allowing LED light to travel within the internal structure without using a conventional diffuser. Thus, the thickness of the overall packaging structure can be significantly reduced.

Further objective of this invention is that LED dice are preferably adopted to the light source units. Since LED dice are much cheaper than packaged LEDs, the present invention integrates the conventional coating processes and the PCB assembly processes into each other. LED dice rather than the packaged LED are adopted in the present invention.

Yet a further objective of this invention is to provide a lighting device used as a backlight module for a display or used as a light box. The lighting device of the present invention can be double-side illuminate. The lighting device can be an active light source to present an image itself, or a passive light source to present an image through a panel.

To achieve the abovementioned objectives, the present invention discloses a display and a lighting device thereof. The display further comprises a panel stacked onto the lighting device. The lighting device comprises a substrate, an electrode layer, at least one light source unit, a light scattering layer, a transparent layer and a reflector. The electrode layer is patterned on the substrate. The at least one light source unit is arranged onto the substrate to electrically connect with the electrode layer. The light scattering layer covers the substrate and the electrode layer except the LED die area, the transparent layer overlays the light scattering layer and the at least one light source unit, and the reflector is disposed on the transparent layer. A control circuit is electrically connecting with the electrode layer, which is capable of selectively activating the plurality of light source units through the electrode layer.

The present invention further discloses a method for manufacturing the lighting device. The method comprises the following steps: providing a substrate; forming a patterned electrode layer on the substrate; arranging a plurality of light source units onto the substrate to electrically connect with the electrode layer, wherein each of the light source unit includes a circuit board unit and at least one LED die being packaged onto the circuit board unit; coating a light scattering layer to cover the substrate and the electrode layer; forming a transparent layer overlaying the light scattering layer and the at least one light source unit; and disposing a reflector on the transparent layer.

The detailed technology and preferred embodiments implemented for the subject invention are described in the following paragraphs accompanying the appended drawings for people skilled in this field to well appreciate the features of the claimed invention.

DESCRIPTION OF THE PREFERRED EMBODIMENT

Figure 1:
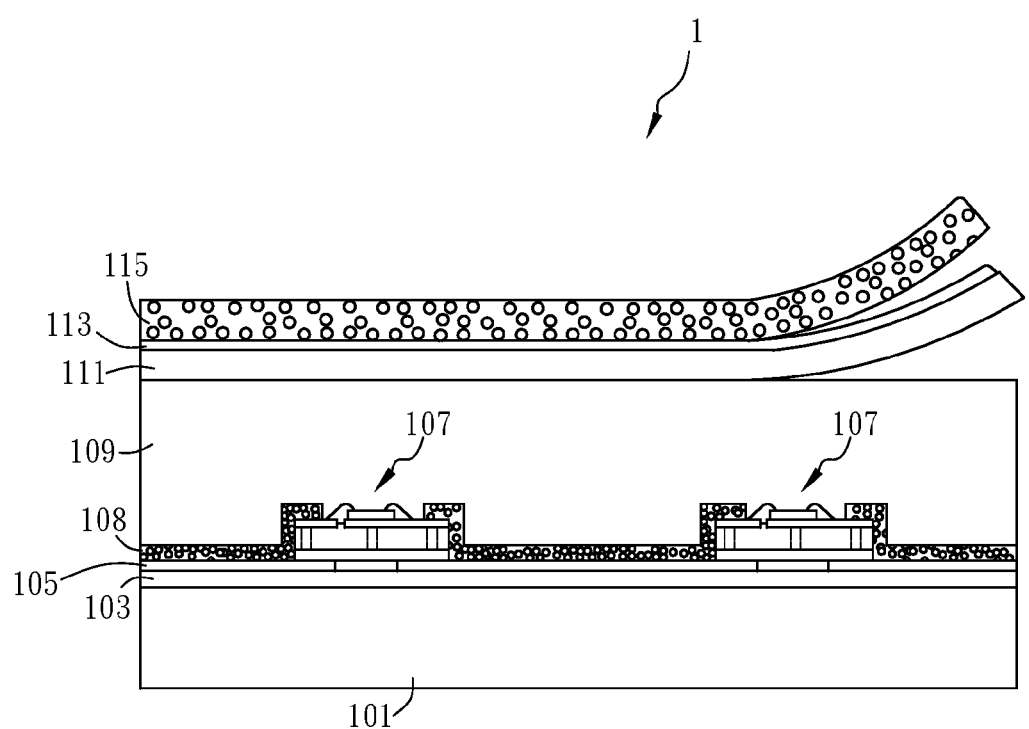
FIG. 1 is a schematic view illustrating the lighting device in an embodiment of the present invention.

The present invention relates to a lighting device, for example, a direct-type backlight module. FIG. 1 shows the lighting device 1 in accordance with the first embodiment of the present invention. The lighting device 1 at least comprises a substrate 101, an electrode layer 105 patterned on the substrate 101, and a plurality of light source units 107. The light source units 107 are arranged onto the substrate to electrically connect with the electrode layer 105. In this embodiment, it is characterized in that each light source unit 107 includes a circuit board unit and at least one light emitting diode (LED) die being packaged onto the circuit board unit. Certainly, the lighting device 1 further comprises a control circuit (not shown in the figures) electrically connects with the electrode layer 105. The control circuit is capable of selectively activating the plurality of light source units 107 through the electrode layer 105 according to the displayed image to achieve the objective of local dimming.

The substrate 101 is a metal plate made of, for example, Al, Ni, Fe, Cu, stainless steel or alloys. The substrate 101 can also be made of plastic, glass, ceramic or polymer composites. The lighting device 1 further comprises an insulation layer 103 formed on the substrate 101. The electrode layer 105 is patterned onto the insulation layer 103. The lighting device 1 further comprises a light scattering layer 108, which is made of, for example, a polymer resin containing titanium dioxide particles (ex. a commercial white color paints), calcium carbonate particles, silicon oxide particles, metallic particles, air microvoids, or a mixture of plurality types of particles, coating the substrate 101 and the electrode layer 105 on areas outside the LED die. The lighting device 1 further comprises a transparent layer 109 overlaying light scattering layer 108 and the light source units 107, a reflector 111 disposed on the transparent layer 109, and a phosphor layer 115 disposed above the reflector 111. The reflector 111 is formed with reflective patterns 113 distributed with respect to the light source units 107.

Figure 2A:
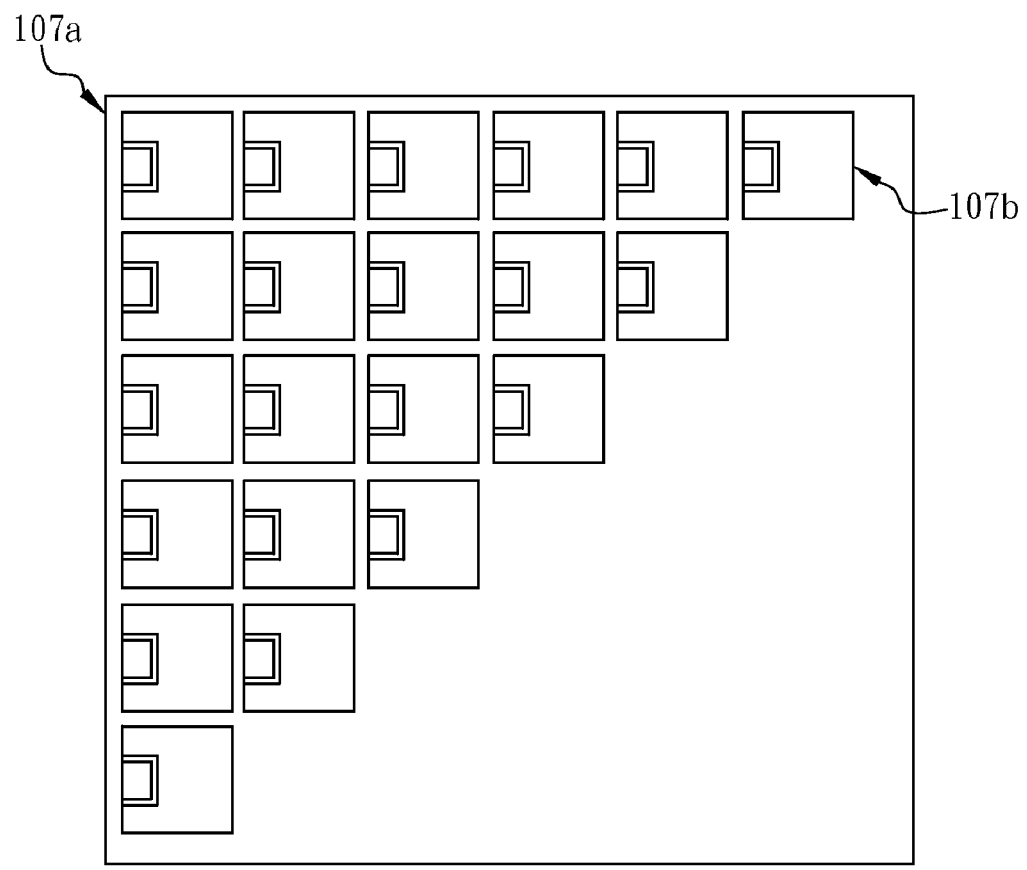
FIG. 2A to FIG. 4B are schematic views illustrating the processes of manufacturing the light source units.
Figure 2B:
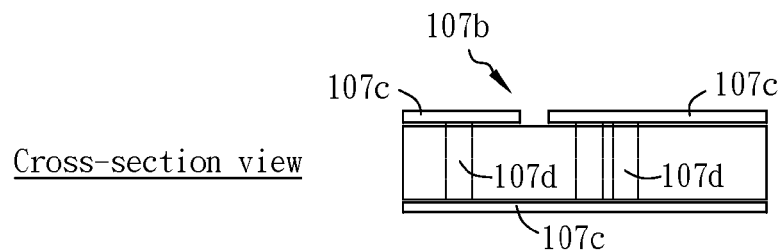
Figure 2C:
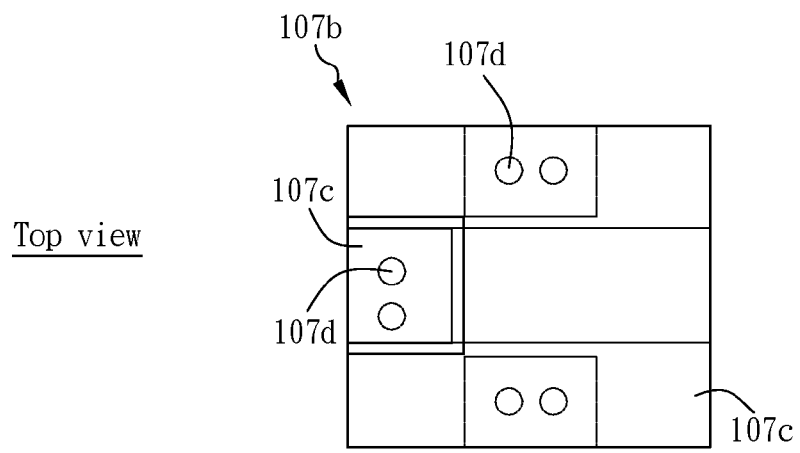
Figure 2D:
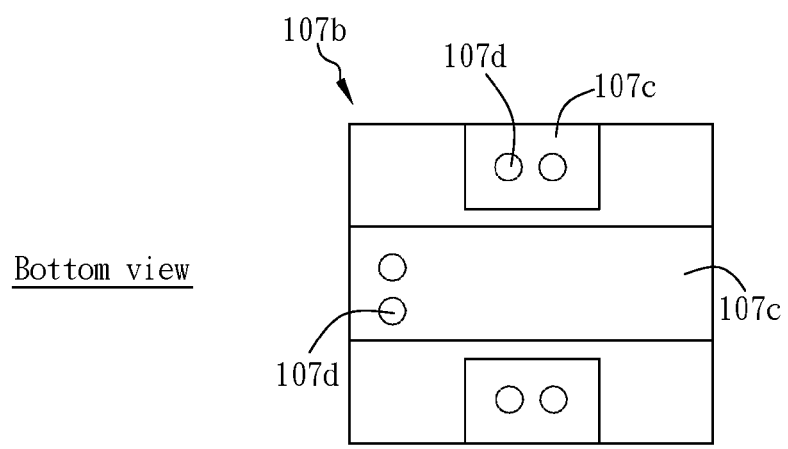

The second embodiment of the present invention relates to a method for manufacturing the lighting device 1 of the first embodiment. Firstly, FIG. 2A to FIG. 4B illustrate the processes of manufacturing the light source units 107. As shown in FIG. 2A and FIG. 2D, a circuit board 107a, for example, a printed circuit board (PCB) or a flexible printed circuit board (FPC), comprising a plurality of circuit board units 107b is provided. The circuit board 107a can be made of epoxy, or polyimide, and formed with metal layers 107c on the top surface and the bottom surface. The metal layers 107c could be Cu, Al, Sn, Ni, or alloys. Each of the circuit board units 107b is also formed with via holes 107d for not only conducting electric current but also conducting heat. The metal layers 107c are purposely designed to have a large surface coverage in order to obtain better heat dissipation from the LED die. Moreover, redundant via holes 107d connecting the top and bottom metal layers 107c are purposely created to enhance the heat conduction from the top metal layer 107c (where the LED die is bonded) to the bottom metal layer 107c which is further connected to the electrode layer 105 of the substrate 101.

Figure 3A:
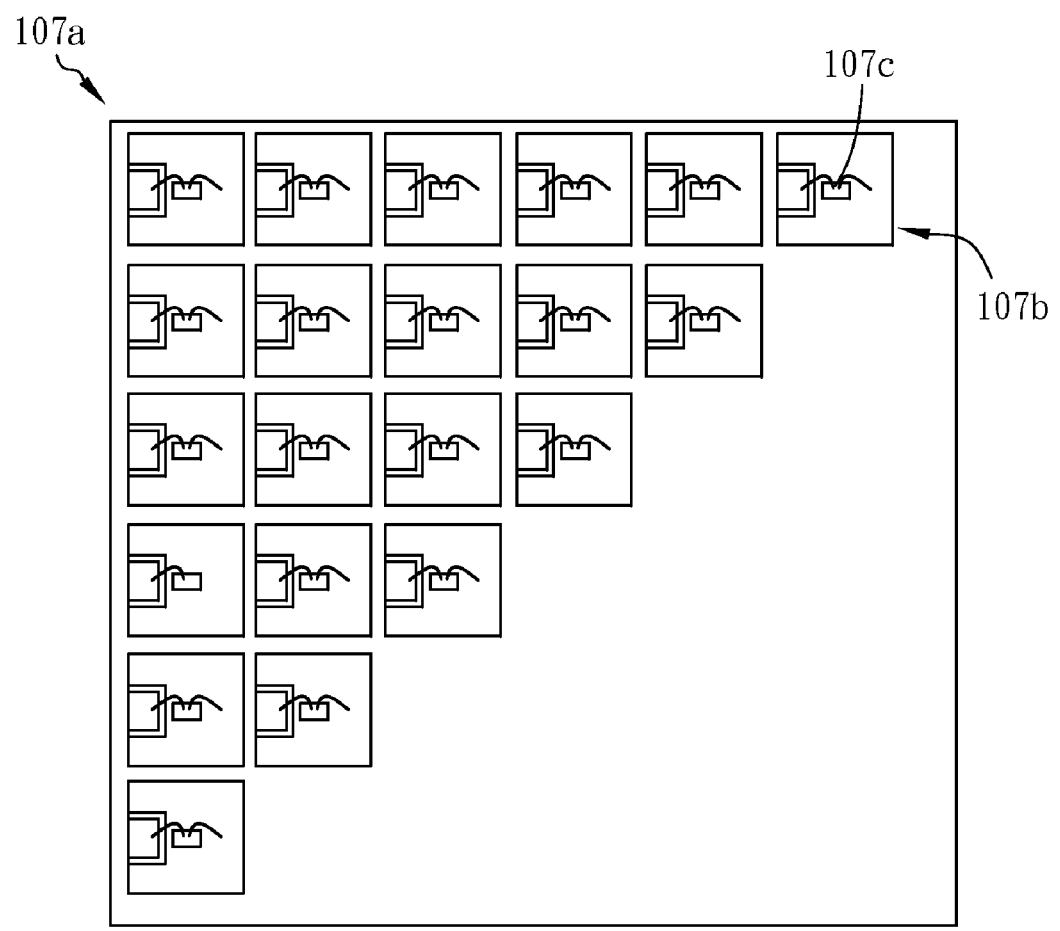
Figure 3B:
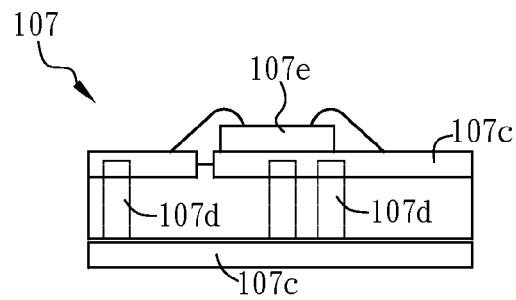
Figure 3C:
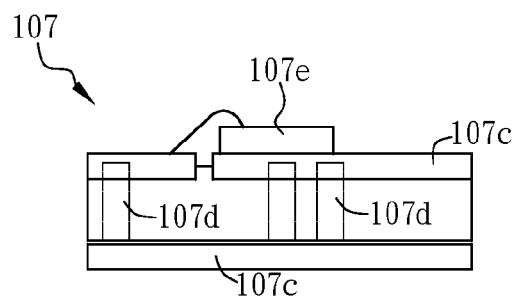
Figure 3D:
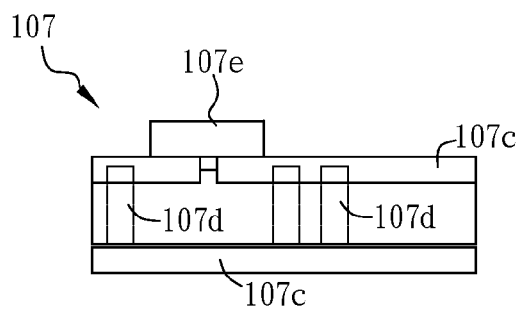

Then, as shown in FIGS. 3A to 3D, a plurality of LED dice 107e are bonded onto the circuit board 107a with respect to the circuit board units 107b. The bonding process could be wire bonding (e.g. the double wire bonding as shown in FIG. 3B and the single wire bonding as shown in FIG. 3C) or flip chip bonding (as shown in FIG. 3D). Since the LED dice 107e rather than packaged LEDs are adopted in the present invention, the costs of the lighting device 1 could be reduces and the design freedom could be increased.

Figure 3E:
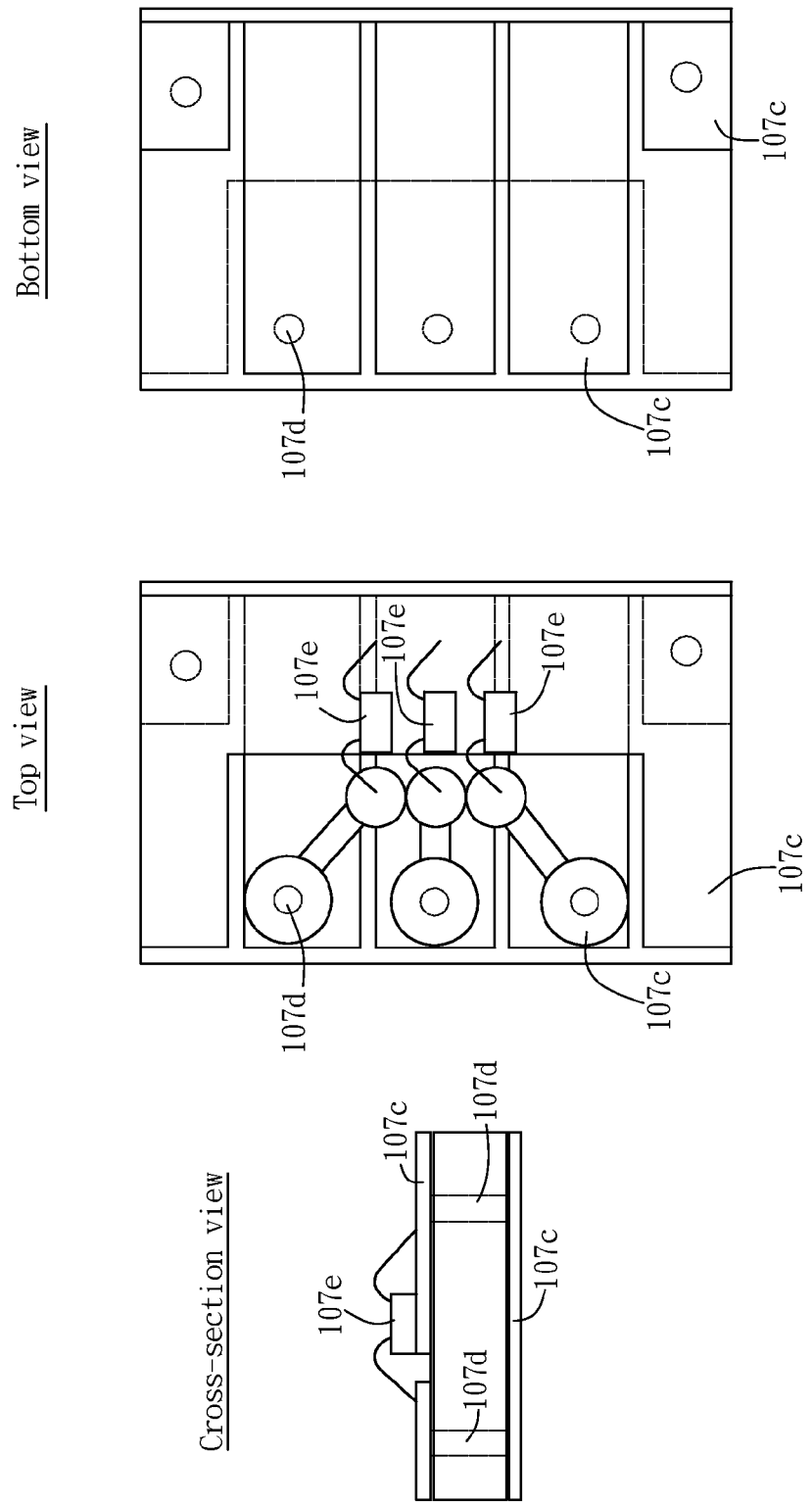
Figure 3F:
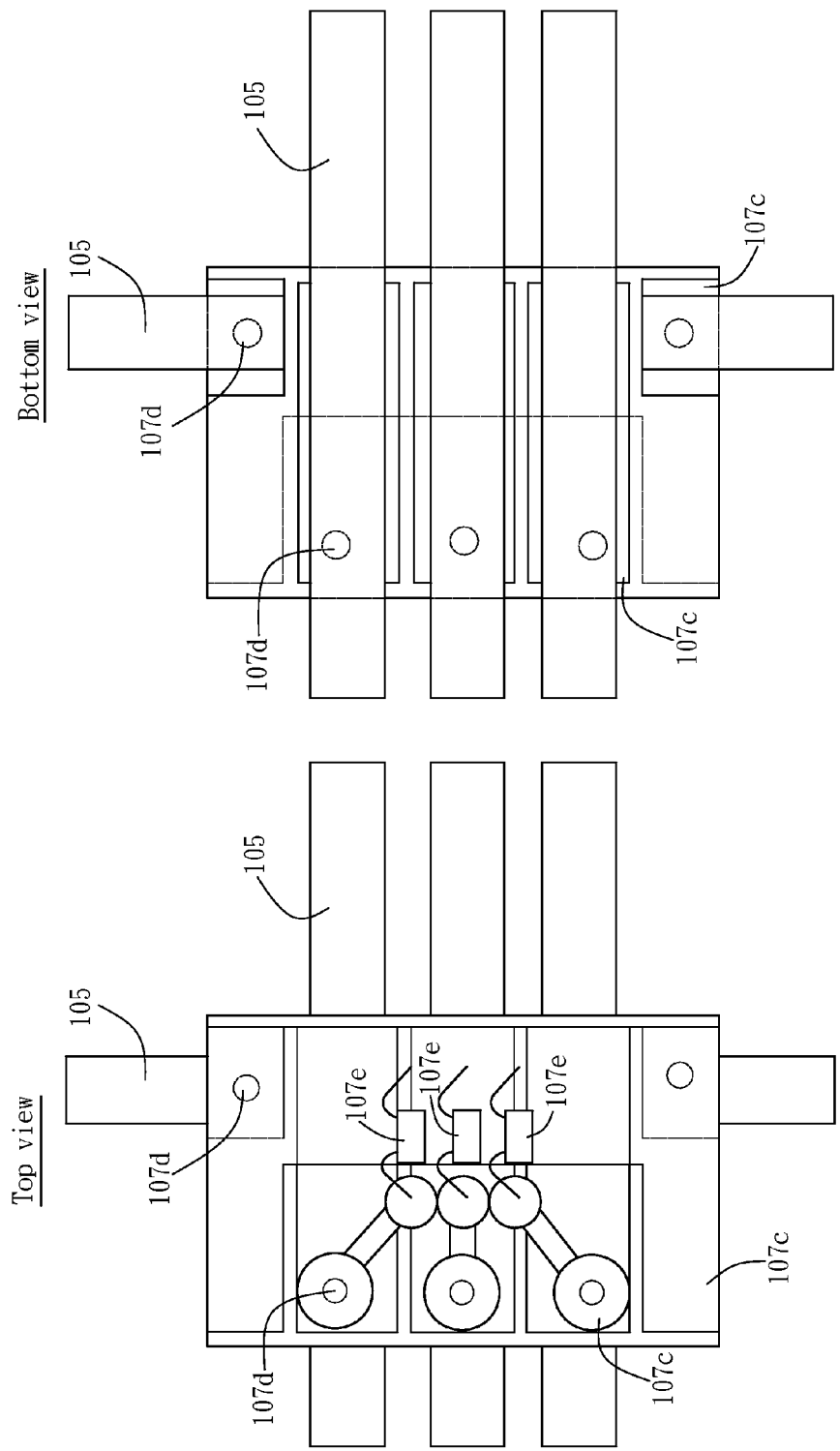

It is noted that the light source unit 107 can comprise a circuit board unit 107b and a plurality of LED dice 107e bonded onto the circuit board unit 107b. Each of the LED dice could be a red LED die, a green LED die, a blue LED die, or a UV LED die. As shown in FIG. 3E, three LED dice 107e, a red LED die, a green LED die and a blue LED die, are bonded onto the circuit board unit 107b. The metal layers 107c are purposely designed for electrically connecting with the patterned electrode layer 105, as shown in FIG. 3F. Thus, the LED dice 107e can be independently controlled via the electrode layer 105.

Figure 4A:
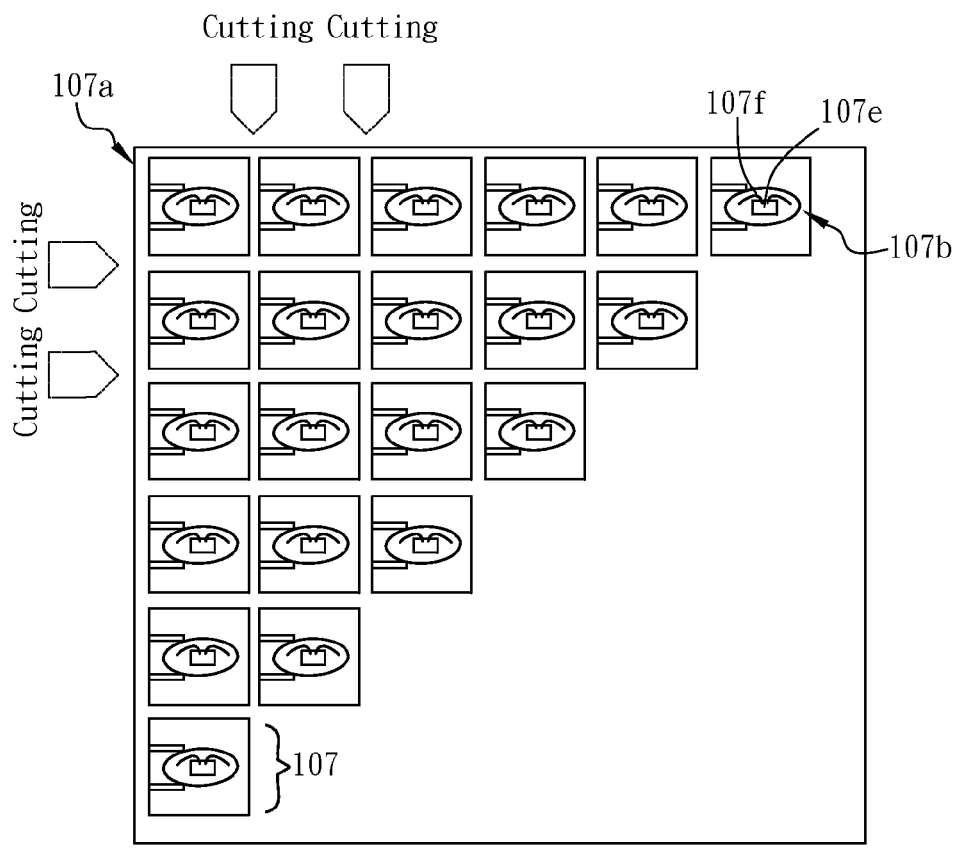
Figure 4B:
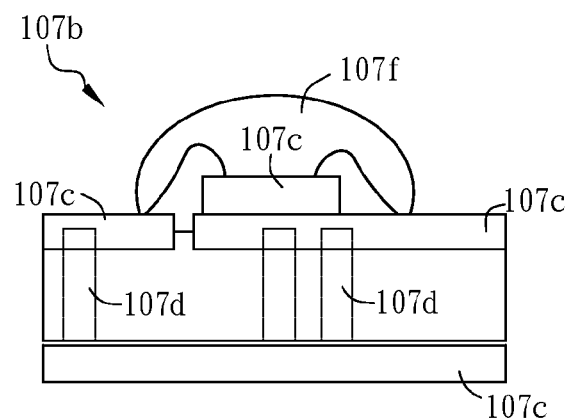

Preferably, as show in FIGS. 4A and 4B, each of the LED dice 107e is encapsulated by applying encapsulant 107f onto the LED dice 107e. The encapsulant 107f includes any conventional glue being dispensed on to the LED dice 107e to enclosed and protect the LED dice 107e in the afterwards processes. The encapsulant 107f could be made of transparent polymer materials such as epoxy, polyurethane, polycarbonate, polyester, silicone type polymers, or polyacrylic resin. The encapsulant 107f could also be made of transparent polymer materials containing light scattering particles such as titanium dioxide particles, calcium carbonate particles, silica oxide particles, metallic particles, or air microvoids or a mixture of plurality types of particles. Alternatively, the encapsulant 107f could be made of a phosphor material for converting light emitted from the LED dice 107e into white light.

Subsequently, a cutting or sawing process is performed to form the light source units 107. In this manner, the light source units 107 each including a circuit board unit 107a and a LED die 107e being packaged onto the circuit board unit 107a can be fabricated in a highly compact format to provide a great quantity to reduce the costs. For example, the PCB 107a having a scale of 100(mm)×100(mm) could be cut to 400 (i.e. 20×20) pieces of light source units 107 in which each of the light source units 107 has a scale of 5(mm)×5(mm). After the cutting or sawing process, the light source units 107 are then placed on a tray in a desired orientation, so that facilitating the pick-and-place in the following processes.

Figure 5A:
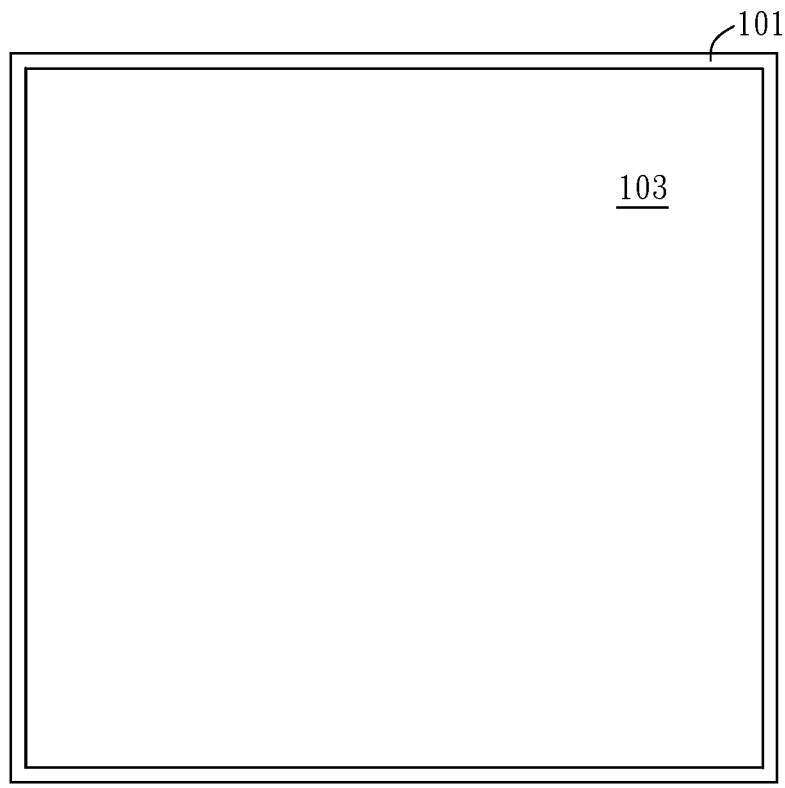
FIG. 5A and FIG. 5B are schematic views illustrating a process of forming the insulation layer on the substrate.
Figure 5B:
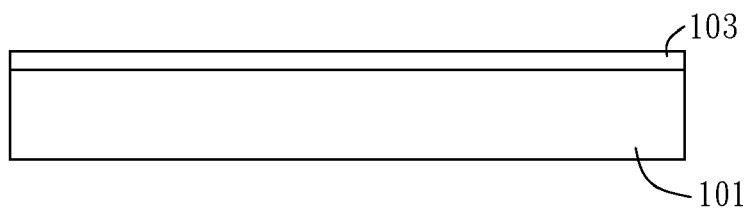

Moreover, the following processes could be performed simultaneously. As shown in FIG. 5A and FIG. 5B, the substrate 101 is provided. The substrate 101 could be a metal plate or a metal sheet which is made of aluminum, copper, iron, stainless steel, or any type of alloys. It can also be made of plastic, ceramic, glass, or any composite materials. In case of the substrate 101 being electrically conductive, an insulation layer 103 (or a dielectric coating) will be needed and formed onto the substrate 101. Alternatively, the insulation layer 103 can be any material at low conductivity such as polymer coating (for example, polystyrene, polymethylmethacrylate, polyvinylchloride, polyurethane, polyimide, polyamide, polycarbonate, polyacrylic resin, and etc), any type of paints (for example, white color paint, oil based or water based paints, and etc) or any composite coating material. Alternatively, the insulation layer 103 can be formed directly on the surface of the metal plate by electroplating or by surface treatment using chemical or electrical approaches (ex. oxidation or anodic treatment).

Figure 6A:
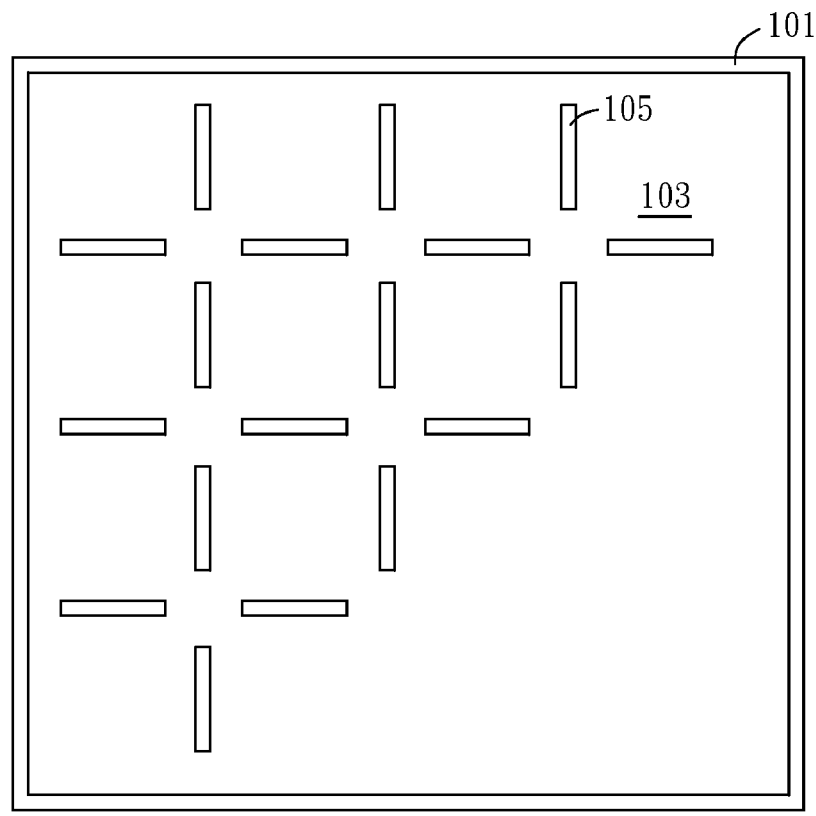
FIG. 6A and FIG. 6B are schematic views illustrating a process of patterning the electrode layer.
Figure 6B:
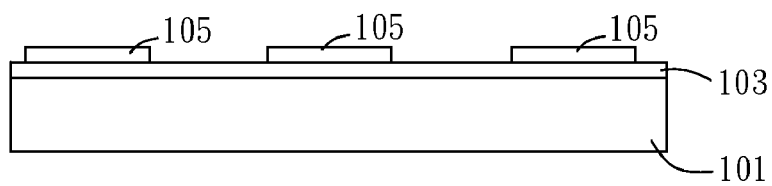

Then, as shown in FIG. 6A and FIG. 6B, the electrode layer 105 is patterned on the substrate 101 (or on the insulation layer 103). Preferably, the electrode layer 105 can be made of silver paste/ink, carbon black paste/ink, copper paste/ink, or any combination of polymer resin with conductive particles such as Ag, Au, Al, Cu, Fe, or carbon black. The conventional coating methods such as screen printing, flexo printing, stamp printing, inkjet printing, gravure printing, and thermal transferring can be adapted for patterning the electrode layer 105. Alternatively, a conductive layer can be formed on the insulation layer 103 in advance and then being etched to form the patterned electrode layer 105. Another alternative, the patterned electrode layer 105 on the substrate 101 can be a traditional PCB. The pattern of the electrode layer 105 is preferably designed, e.g. in X and Y directions.

Figure 7A:
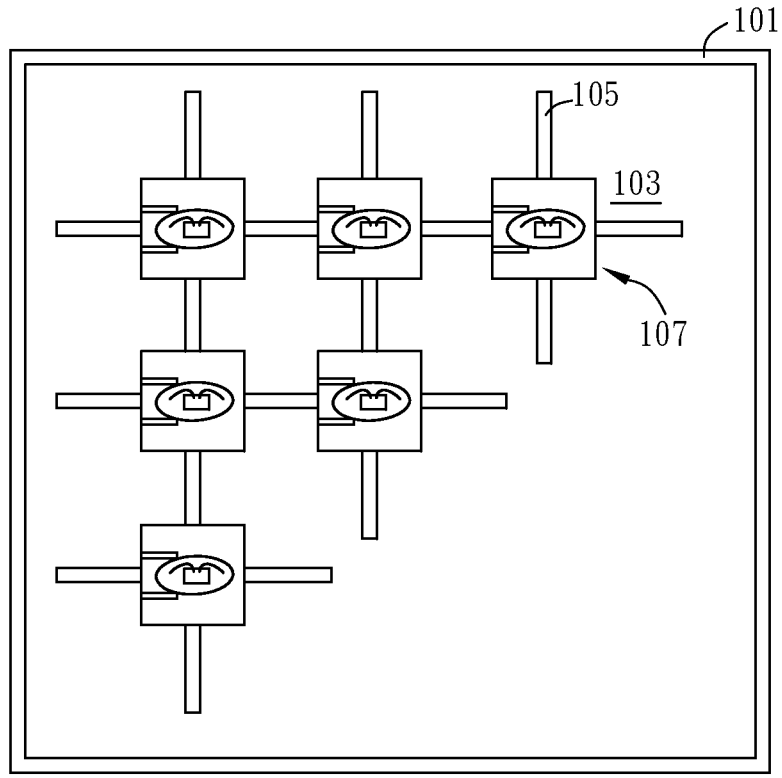
FIG. 7A to FIG. 7C are schematic views illustrating a process of arranging the light source units onto the substrate.
Figure 7B:
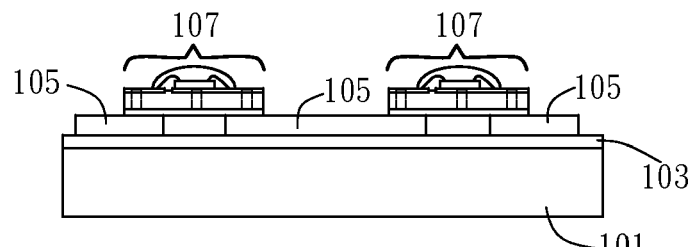
Figure 7C:
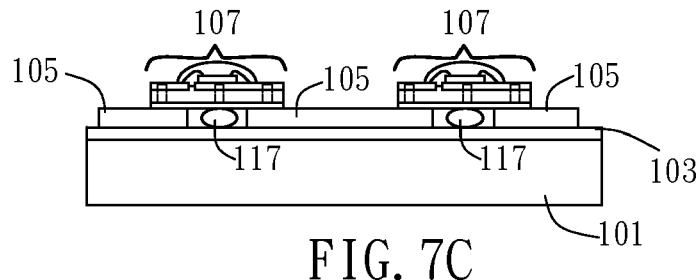

Referring to FIG. 7A to FIG. 7C, in which FIG. 7A is the top plan view whereas FIG. 7B and FIG. 7C is the cross-sectional view, the light source units 107 can be arranged onto the substrate 101 to electrically connect with the electrode layer 105. Thus, each of the light source units 107 can be independently controlled by the control circuit as desired. As shown in FIG. 7C, for ensuring the circuit board unit 107b of the light source units 107 adhering to the substrate 101, an additional drop of glue 117 can be applied underneath the circuit board unit 107a. After the light source units 107 are placed onto the substrate 101, they are then subjected to a baking process. The baking temperature and baking time is determined by the type of the electrode layer 105.

Figure 8:
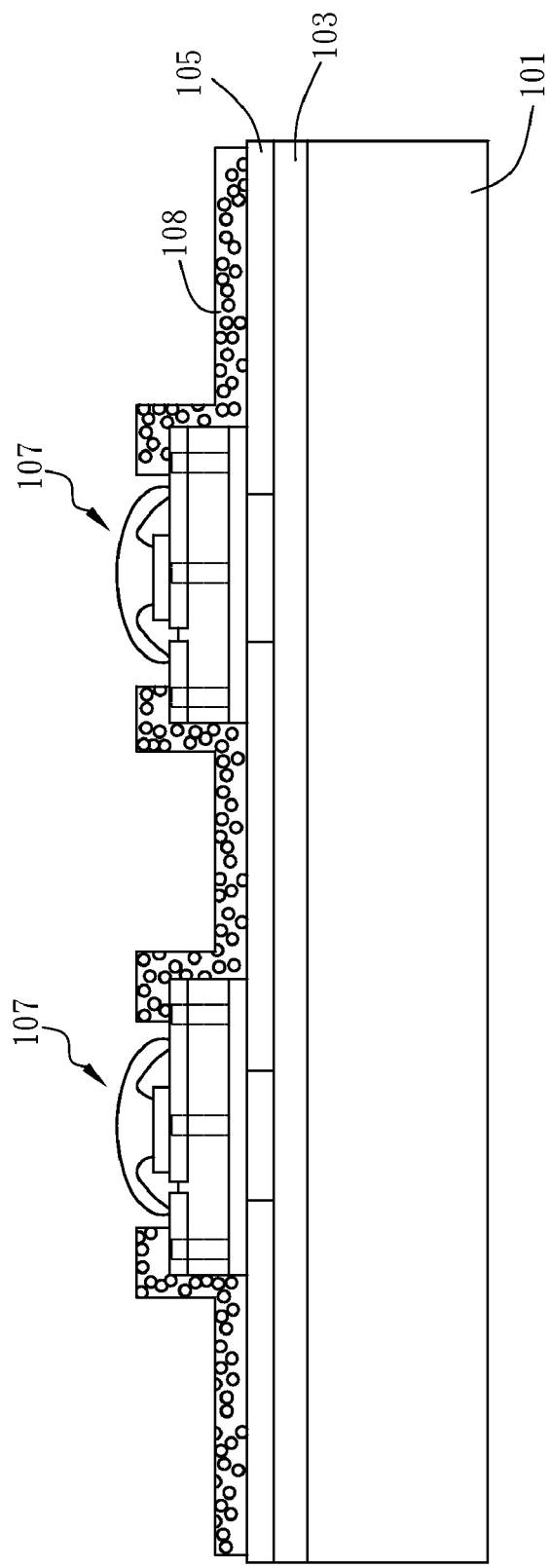
FIG. 8 is a schematic view illustrating a process of coating the light scattering layer.

For enhancing the brightness performance of the backlight module 1, the light scattering layer 108 is disposed to cover the substrate 101 and the electrode layer 105 except the LED die area as shown in FIG. 8. As in one of the manufacturing methods, a mask is disposed on the substrate 101, which is designed for sheltering only the LED die area on the light source units 107. Then, the light scattering layer 108, such as commercial white paints, $TiO_2$ paste, $CaCO_3$ paste, polymer resin containing white color pigment or containing any shining particles, or air microvoids, is coated (e.g. by spray coating, solution coating or other coating processes) or deposited onto the substrate on areas outside the LED die area. Finally, the mask is removed so that the LED die area remains opened without covering with the light scattering layer 108. A baking process for the light scattering layer 108 may be needed in order to remove any excess solvent and to assure the light scattering layer 108 is dried.

Figure 9:
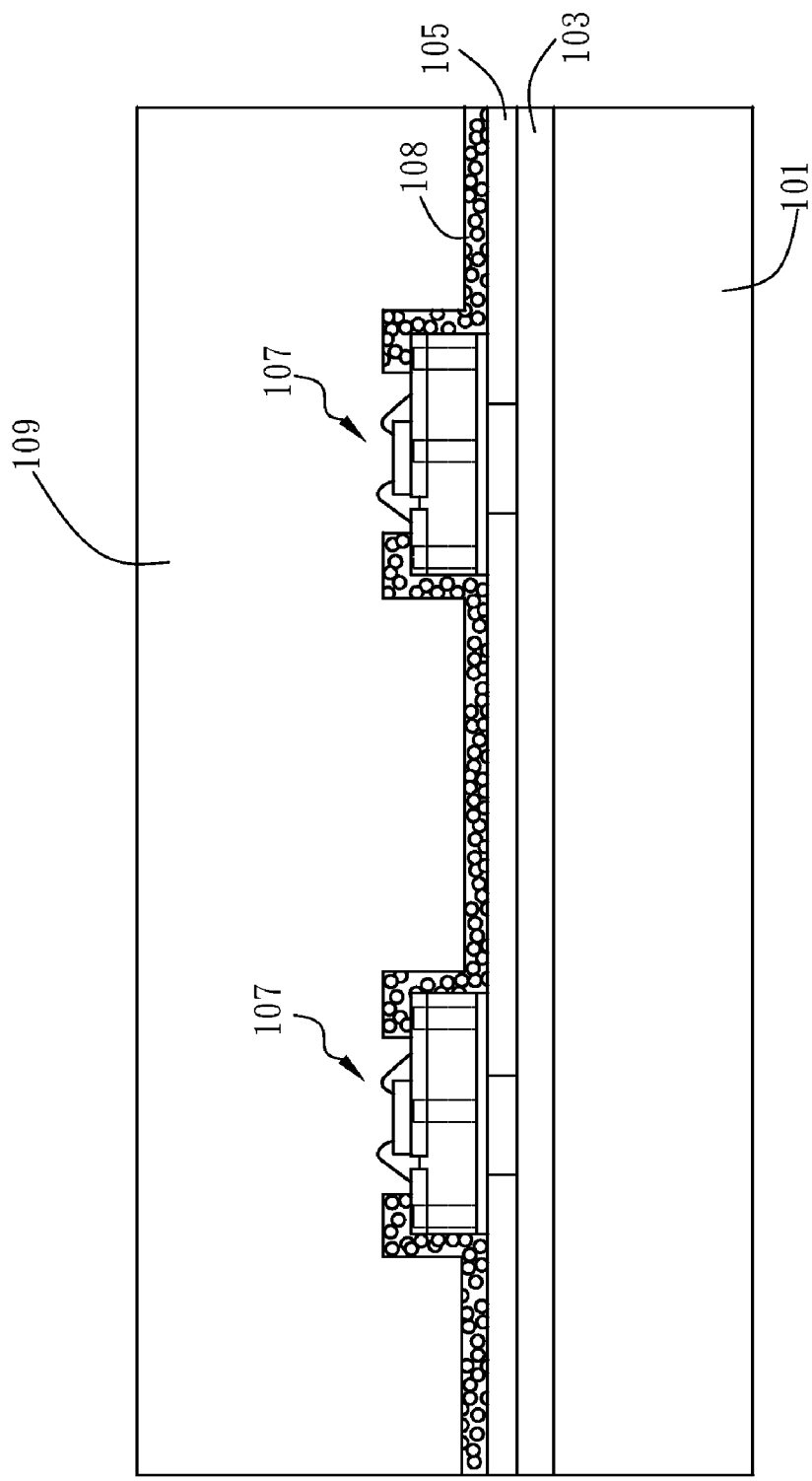
FIG. 9 is a schematic view illustrating a process of forming the transparent layer.

Subsequently, referring to FIG. 9, the transparent layer 109 is coated to overlay the light scattering layer 108 and the light source units 107 and to cover the entire area. The transparent layer 109 can be made of any type of transparent polymeric materials such as silicon rubber, polyurethane, polystyrene, polyester, polycarbonate, polyimide, polyacrylic resin, or a combination of more than one type of transparent polymeric materials. The refractive index of the transparent layer 109 preferably matches with the refractive index of the encapsulant 107f (not shown in FIG. 9) if being used with the reflector 111.

Figure 10:
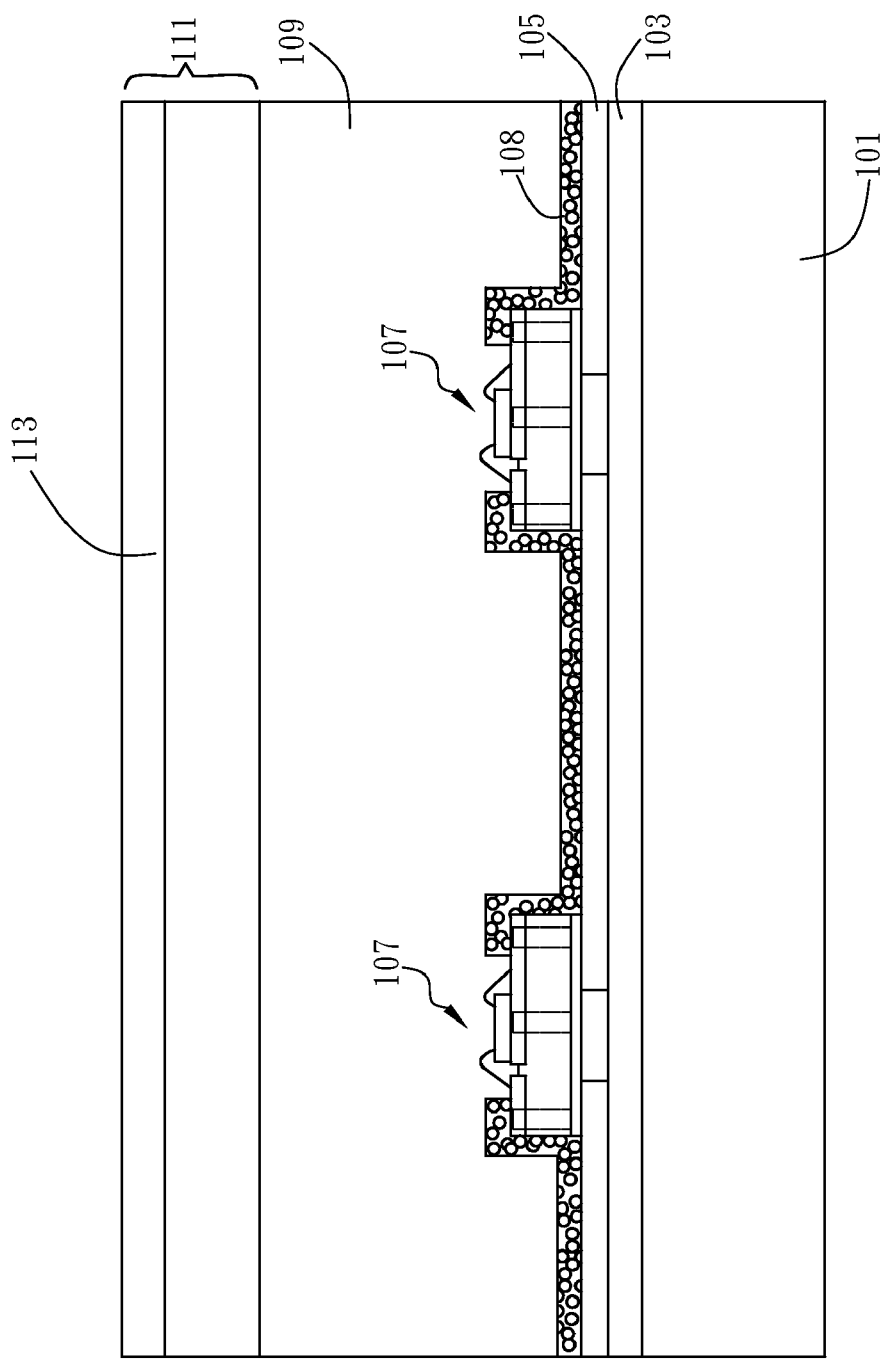
FIG. 10 is a schematic view illustrating a process of disposing the reflector.

Referring to FIG. 10, the reflector 111 having reflective patterns 113 distributed on a plastic substrate, which is preferably made of any type of transparent plastic such as PET, PEN, PES, PU, PS, PC, PE, PP, PI, or ABS, with respect to the light source units 107 is then disposed on the transparent layer 109. The reflective patterns 113 are distributed in such ways that the patterns above the light source units 107 are in a higher density. Thus, the reflector 111 helps light emitted from the light source units 107 travels towards the area without LEDs being disposed directly thereunder. The reflective patterns 113 are fabricated by depositing a thin layer of metal film on the plastic substrate using a conventional vacuum deposition process such as sputtering, thermal deposition and ion beam deposition. The reflective patterns 113 of the metal film can be fabricated by photolithagraphy process, direct etching process, lift-off process, . . . , etc. The metal film may include Ag, Al, Ni, Cr, Mo, Cu, Au, or Pt. The reflective patterns 113 could also be made by patterning white color paint or reflective paints onto the plastic substrate.

Figure 11A:
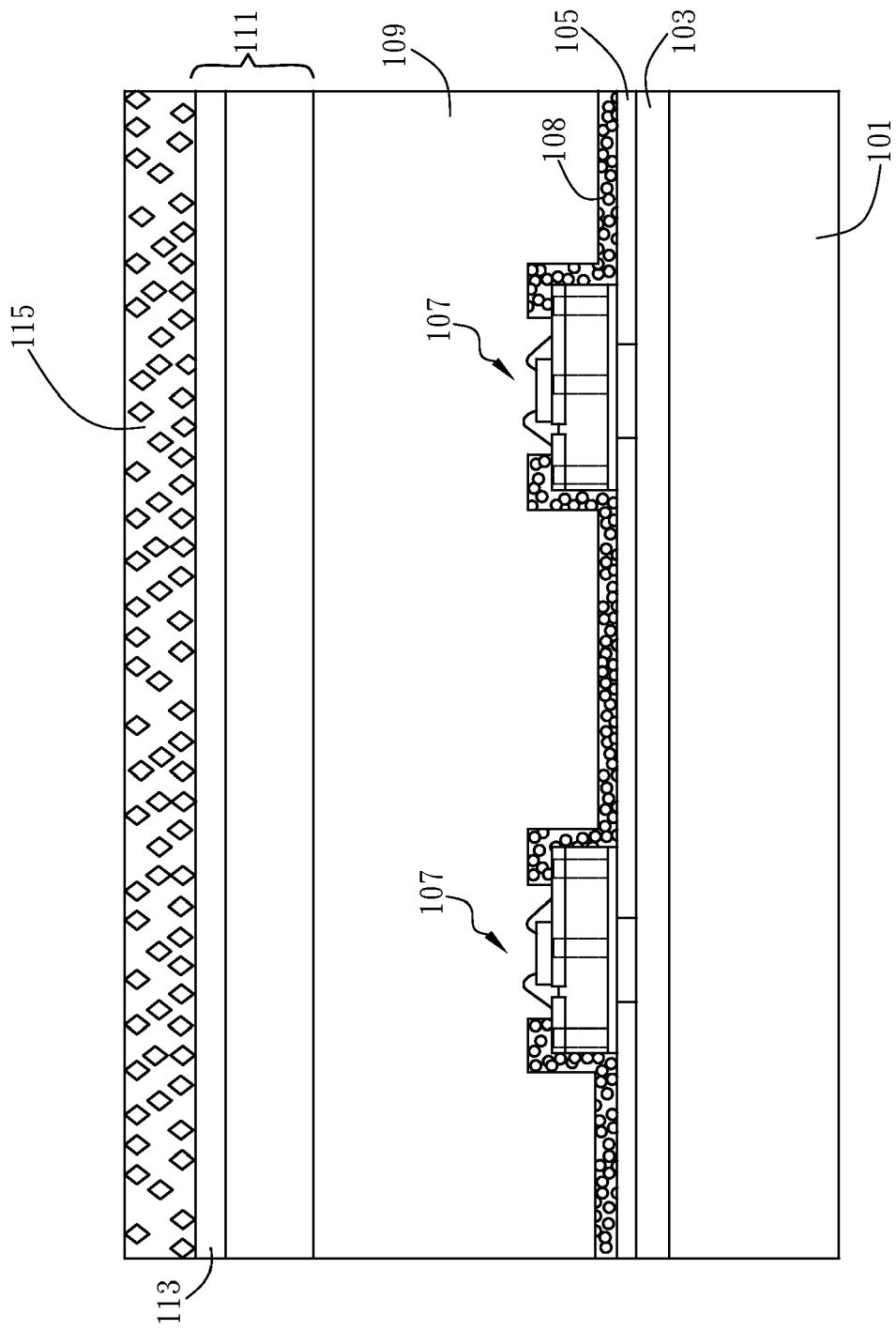
FIG. 11A to FIG. 11I are schematic views illustrating a process of forming the phosphor layer.
Figure 11B:
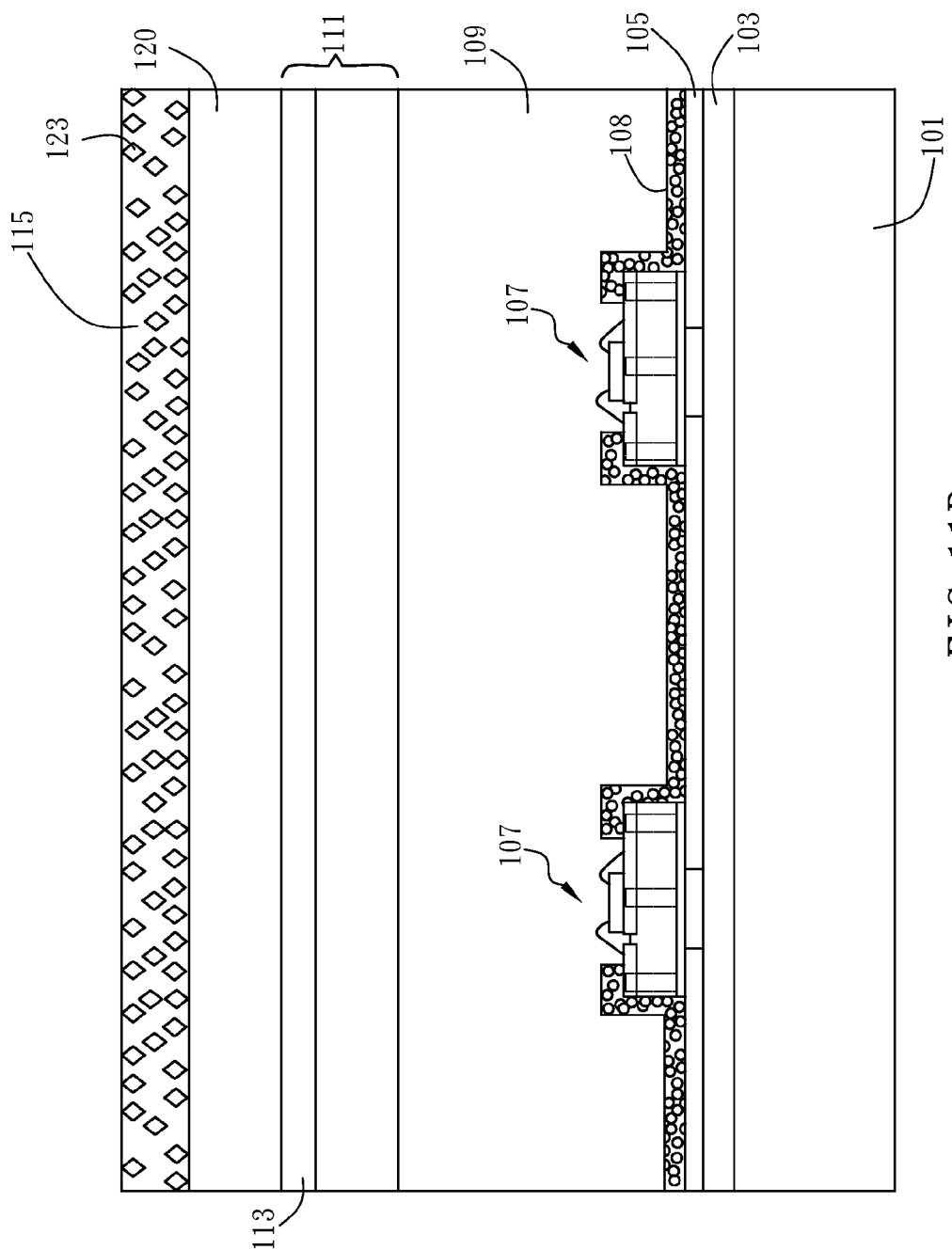
Figure 11C:
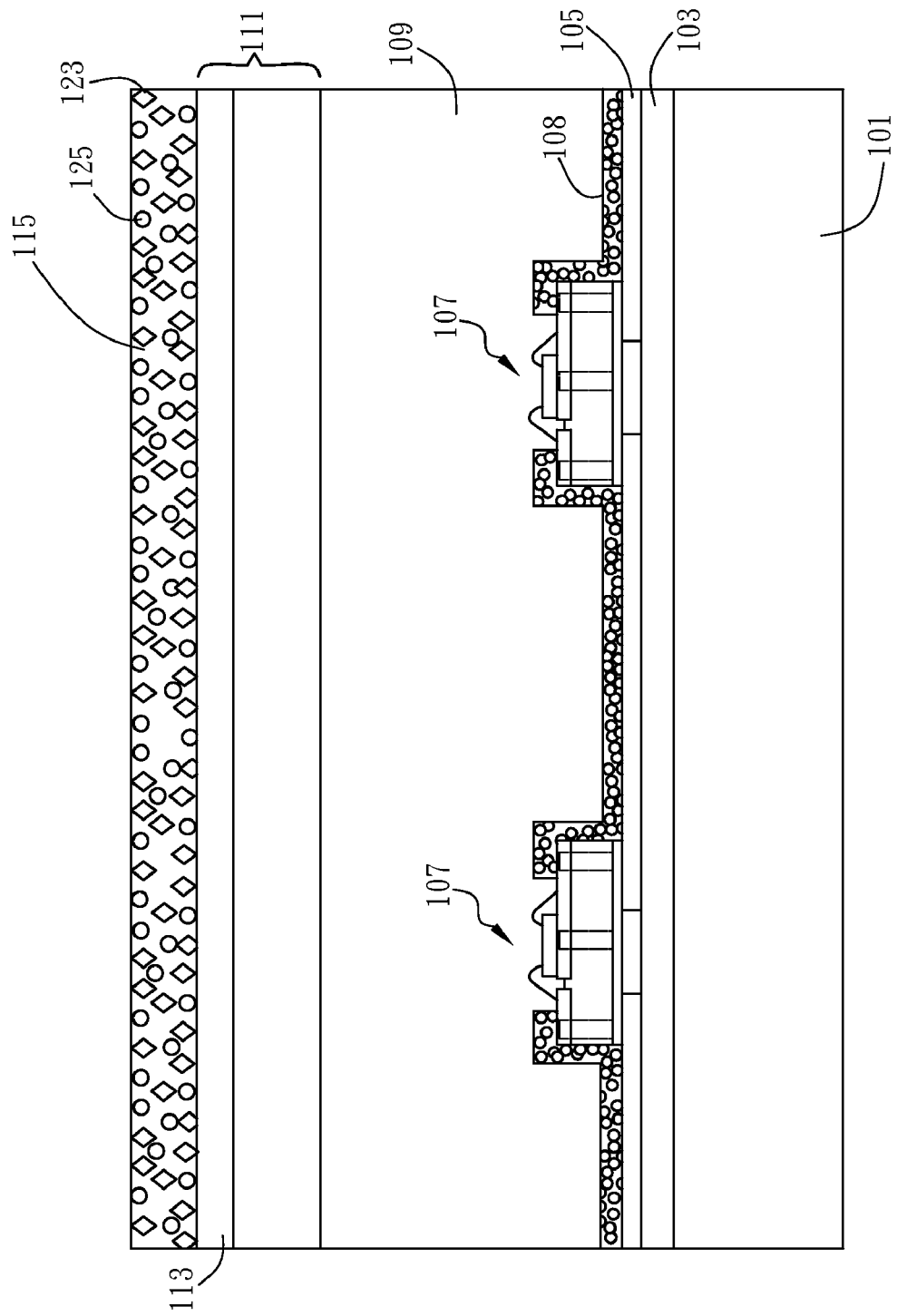
Figure 11D:
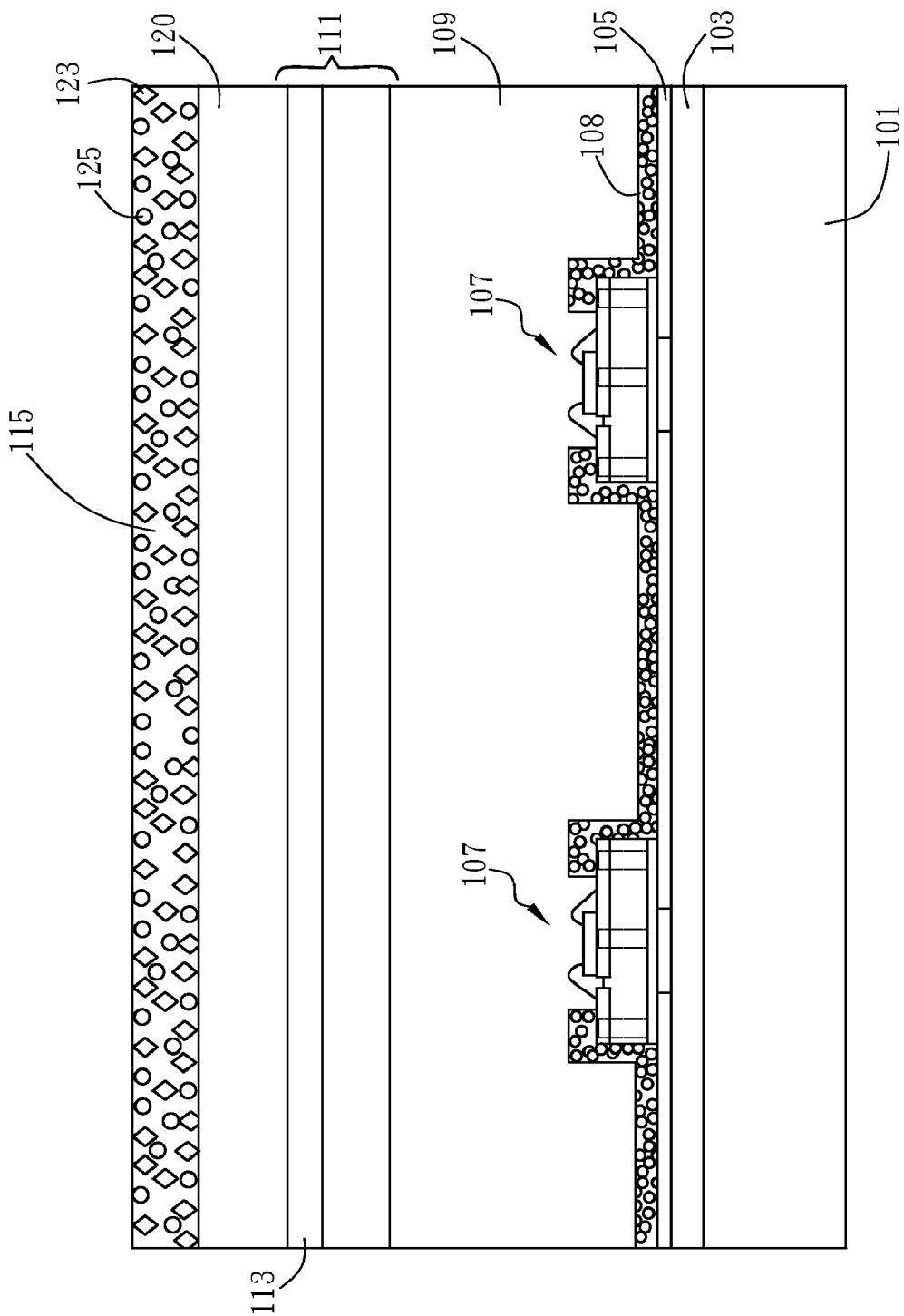
Figure 11E:
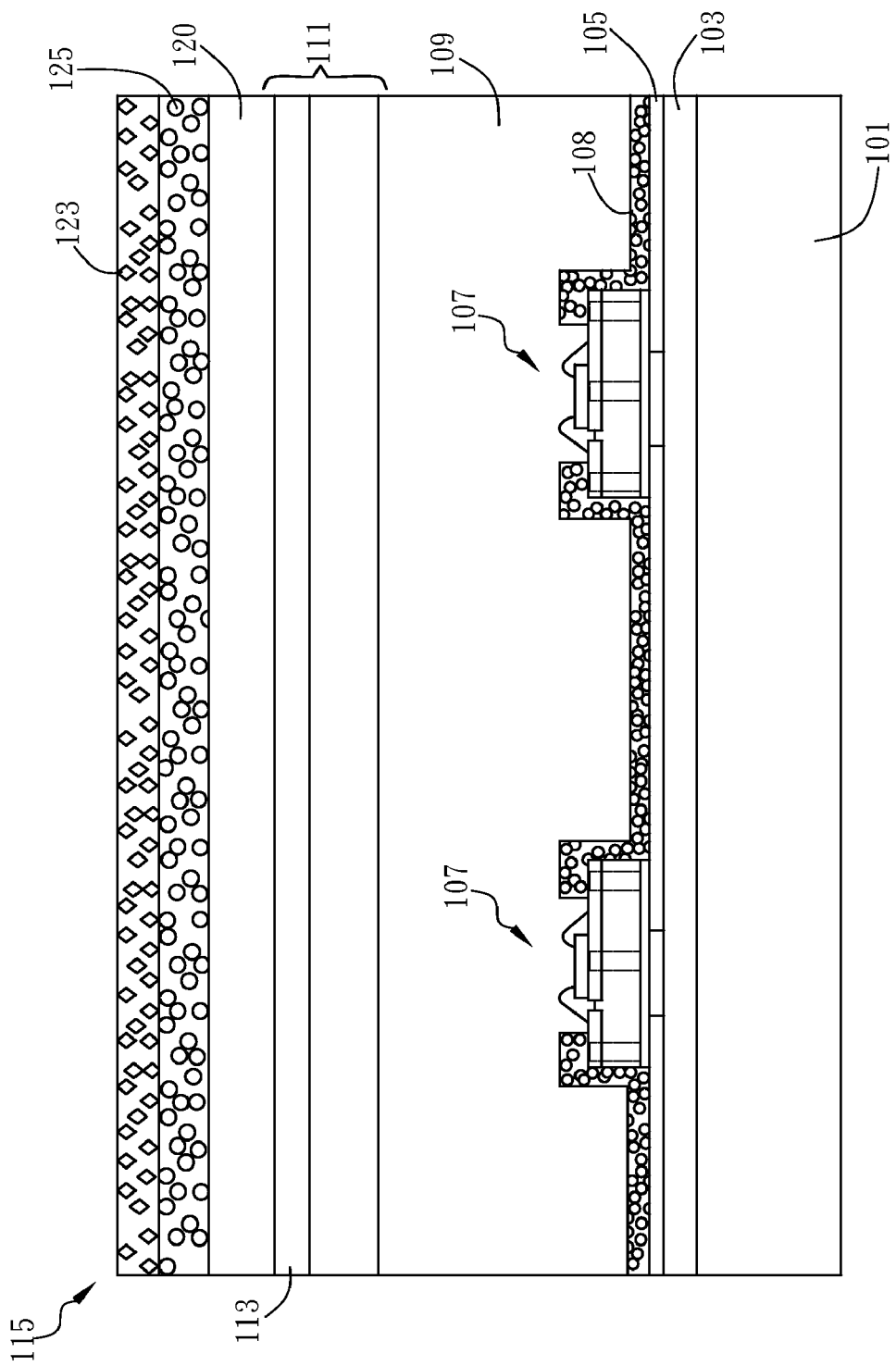
Figure 11F:
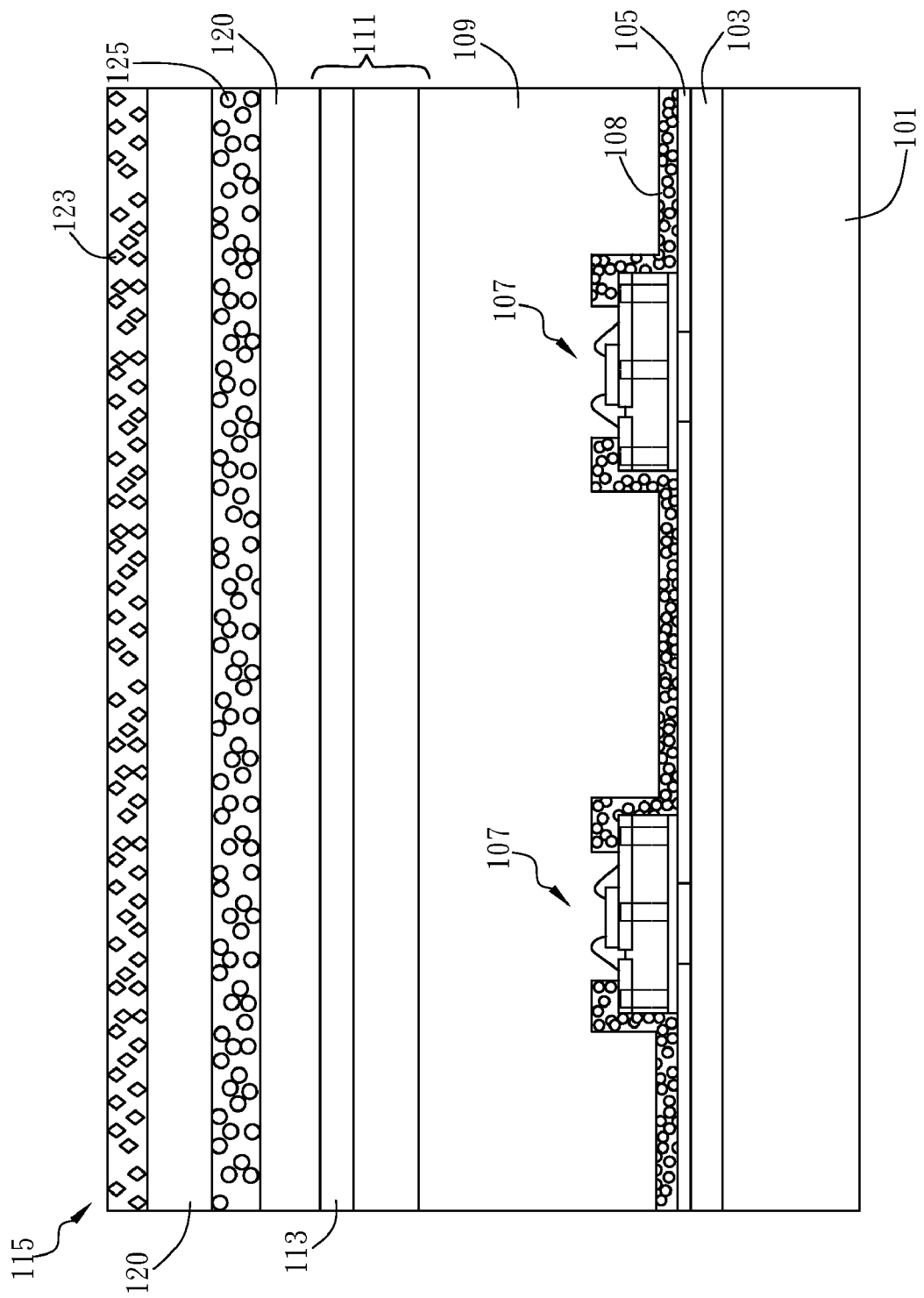
Figure 11G:
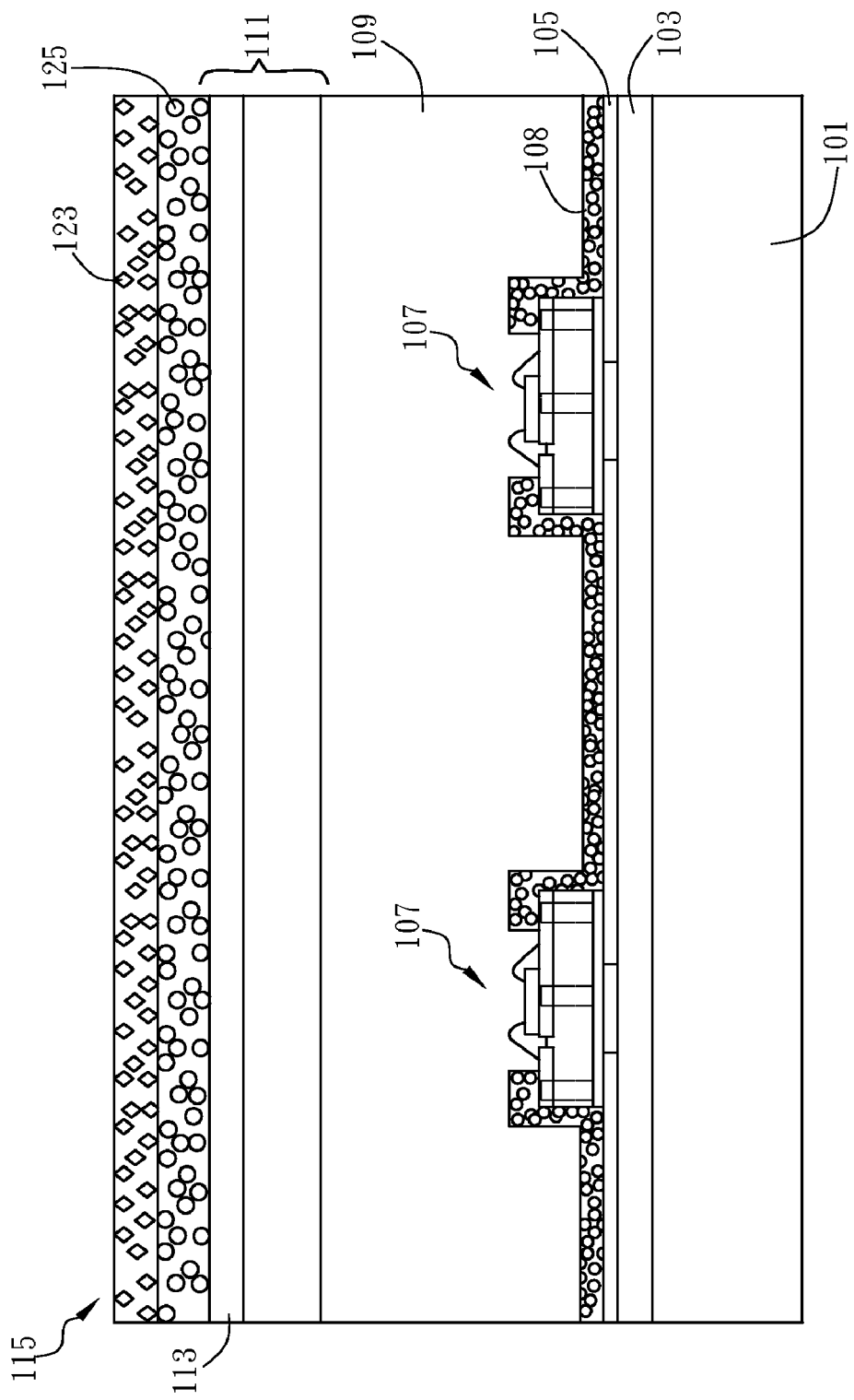

Finally, the phosphor layer 115 is formed above the reflector 111. As shown in FIG. 11A, the phosphor layer 115 can be directly coated on the patterned reflector 111. Alternatively, the phosphor layer 115 can be coated on a transparent plastic film 120 and then be disposed onto the reflector 111 as shown in FIG. 11B. The phosphor layer 115 comprises phosphor particles 123 uniformly mixed in a transparent polymer resin such as silicon rubber, polyurethane, polystyrene, polyester, polycarbonate, polyimide, polyacrylic resin, or a combination of more than one type of transparent polymeric materials. The phosphor layer 115 can be formed by well known coating processes such as screen printing, slot die coating, blade coating, curtain coating, . . . , etc. To enhance the overall light output, light scattering particles 125 such as titanium dioxide, calcium carbonate, silica oxide, air microvoids, . . . , etc, could be incorporated into the phosphor layer 115 with different structural combinations as illustrated in FIG. 11C to FIG. 11H. As shown in FIG. 11C, phosphor particles 123 and light scattering particles 125 are mixed in the phosphor layer 115 to be coated onto the reflector 111. As shown in FIG. 11D, phosphor particles 123 and light scattering particles 125 are mixed in the phosphor layer 115 to be coated onto the transparent plastic film 120 and then be disposed onto the reflector 111. As shown in FIG. 11E, phosphor particles 123 and light scattering particles 125 are sequentially coated onto the transparent plastic film 120 and then be disposed onto the reflector 111. As shown in FIG. 11F, phosphor particles 123 and light scattering particles 125 are separately coated onto the transparent plastic films 120 and then be stacked onto the reflector 111. As shown in FIG. 11G, phosphor particles 123 and light scattering particles 125 directly and separately coated onto the reflector 111.

The phosphor layer 115 is utilized to convert blue light or UV light emitted from the LEDs into white light. For example, when the LED dice 107e is the blue light LED or a "UV" LED, the phosphor layer 115 being made of yellow phosphor material could convert the blue light or UV light into white light and being emitted from the backlight module 1.

Figure 11H:
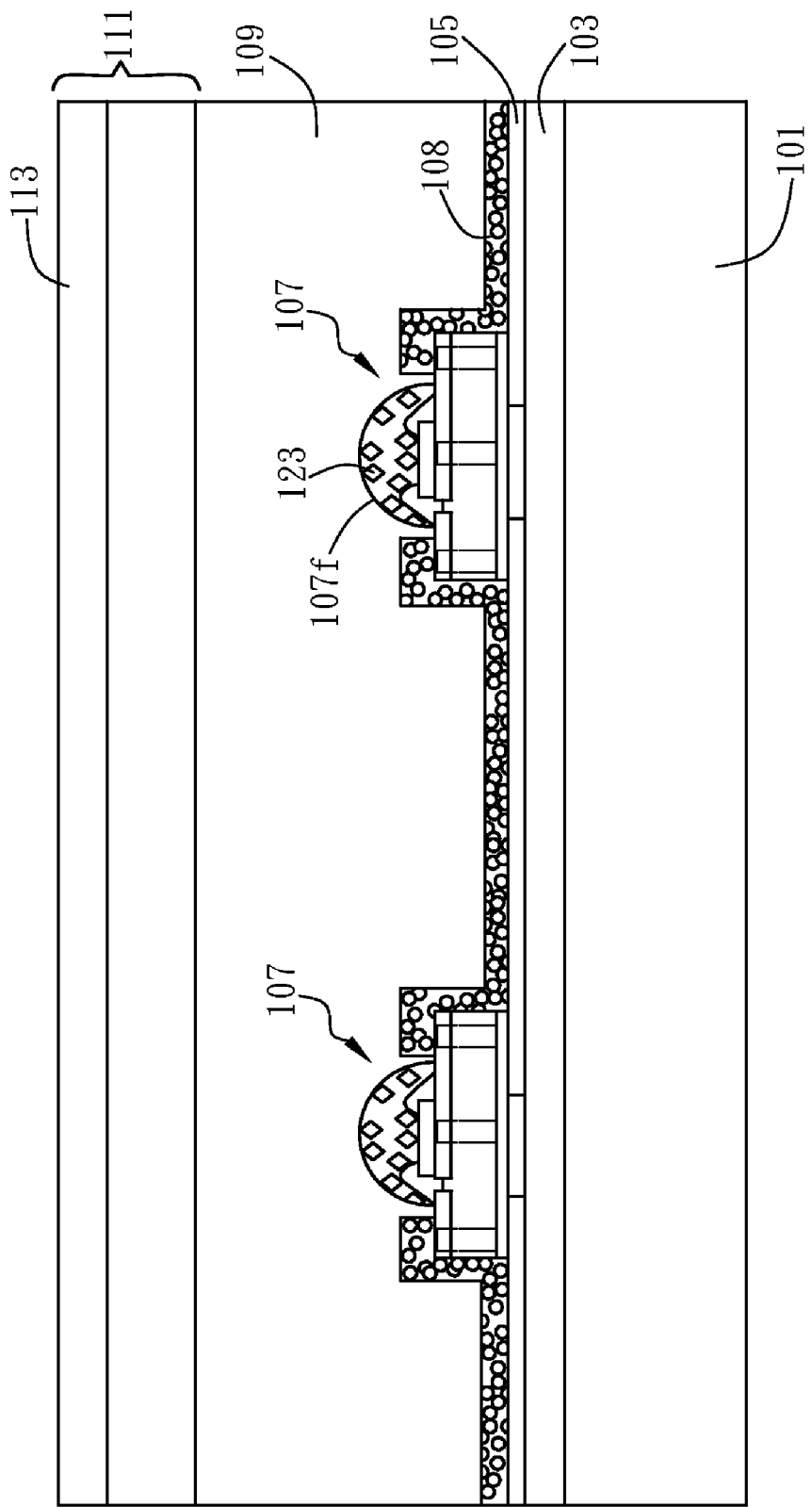
Figure 11I:
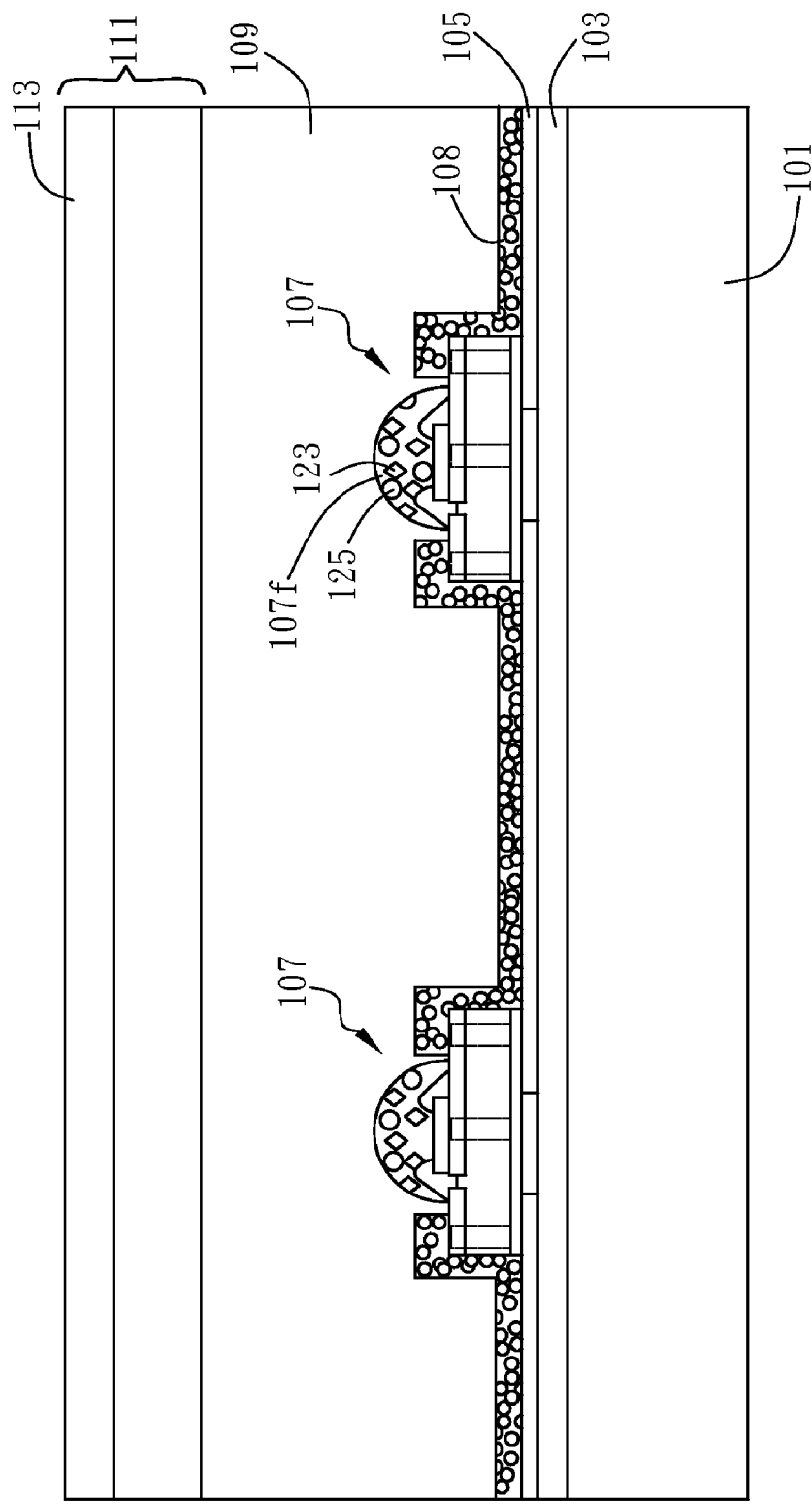

Alternatively, instead of disposing the phosphor layer 115 on the reflector 111, the phosphor material can be added to the encapsulant 107f as described in FIG. 4A. For example, as shown in FIG. 11H, phosphor particles 123 are added to the encapsulant 107f. For another example, as shown in FIG. 11I, both phosphor particles 123 and light scattering particles 125 are added to the encapsulant 107f.

Figure 12A:
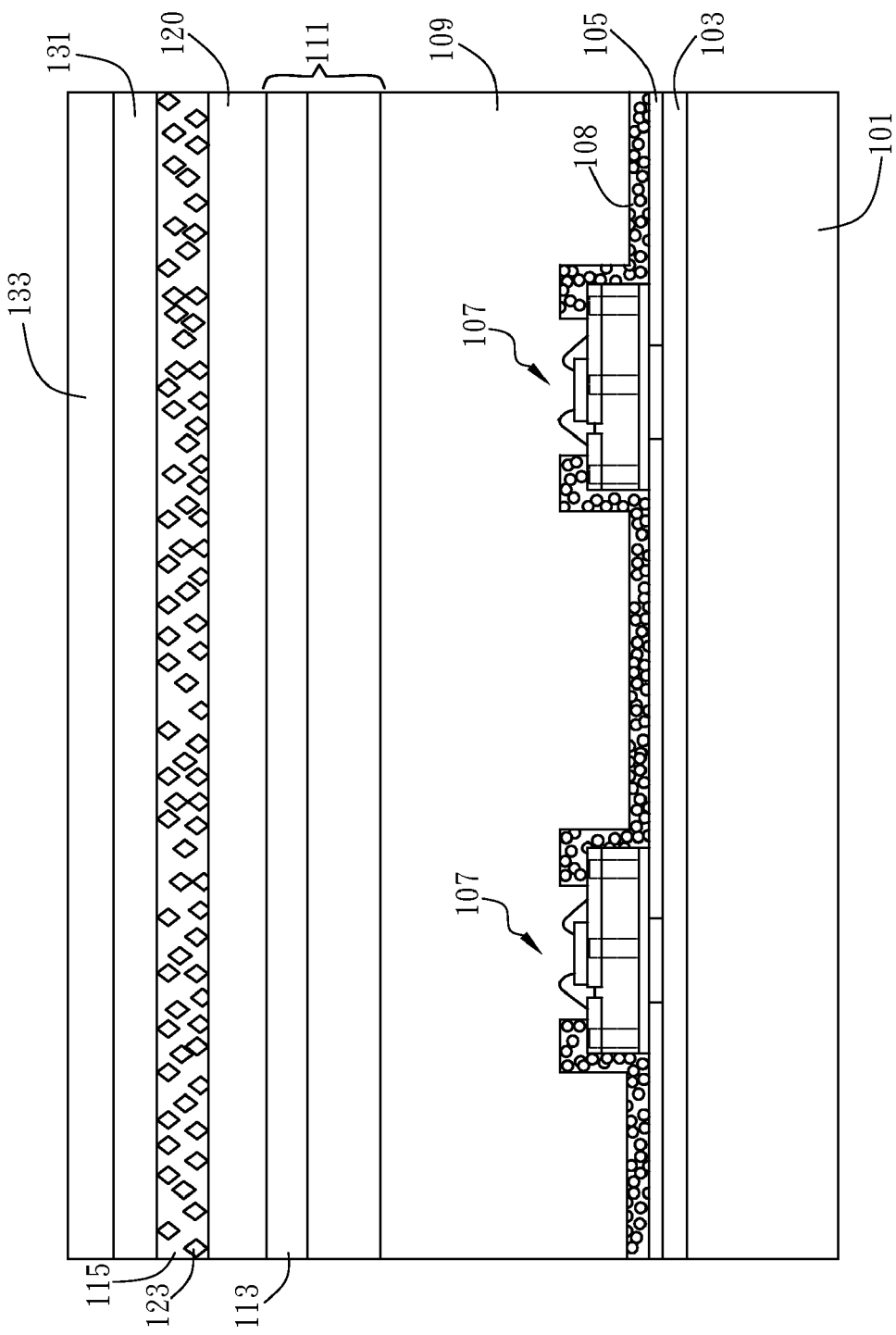
FIG. 12A and FIG. 12B are schematic views illustrating the third embodiment of the present invention.
Figure 12B:
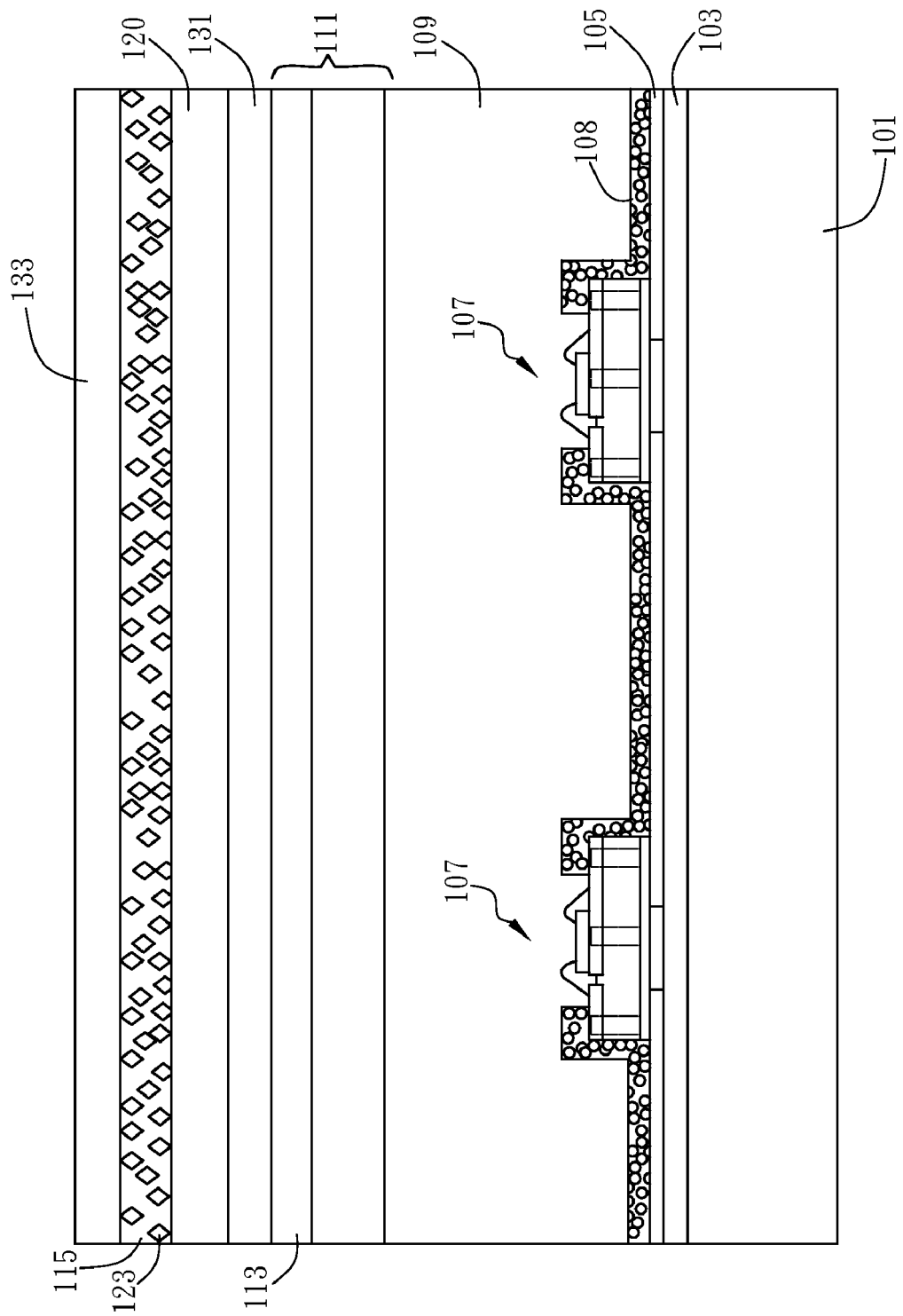

To further enhance the light output from the LED light source, a plurality of optical sheets could be incorporated to the lighting device 1 as described above. For example, as shown in FIG. 12A, one or two pieces of brightness enhanced film (BEF) 131 is disposed on top of the phosphor layer 115 and a diffuser film 133 is then disposed on top of the BEF 131. For another example, as shown in FIG. 12B, the brightness enhance film 131 is disposed between the reflector 111 and the phosphor layer 115 and the diffuser film 133 is disposed on top of the phosphor layer 115. Other structural arrangements between phosphor layer 115, brightness enhanced film 131 and diffuser film 133 can be changed according to the actual product applications.

Figure 13A:
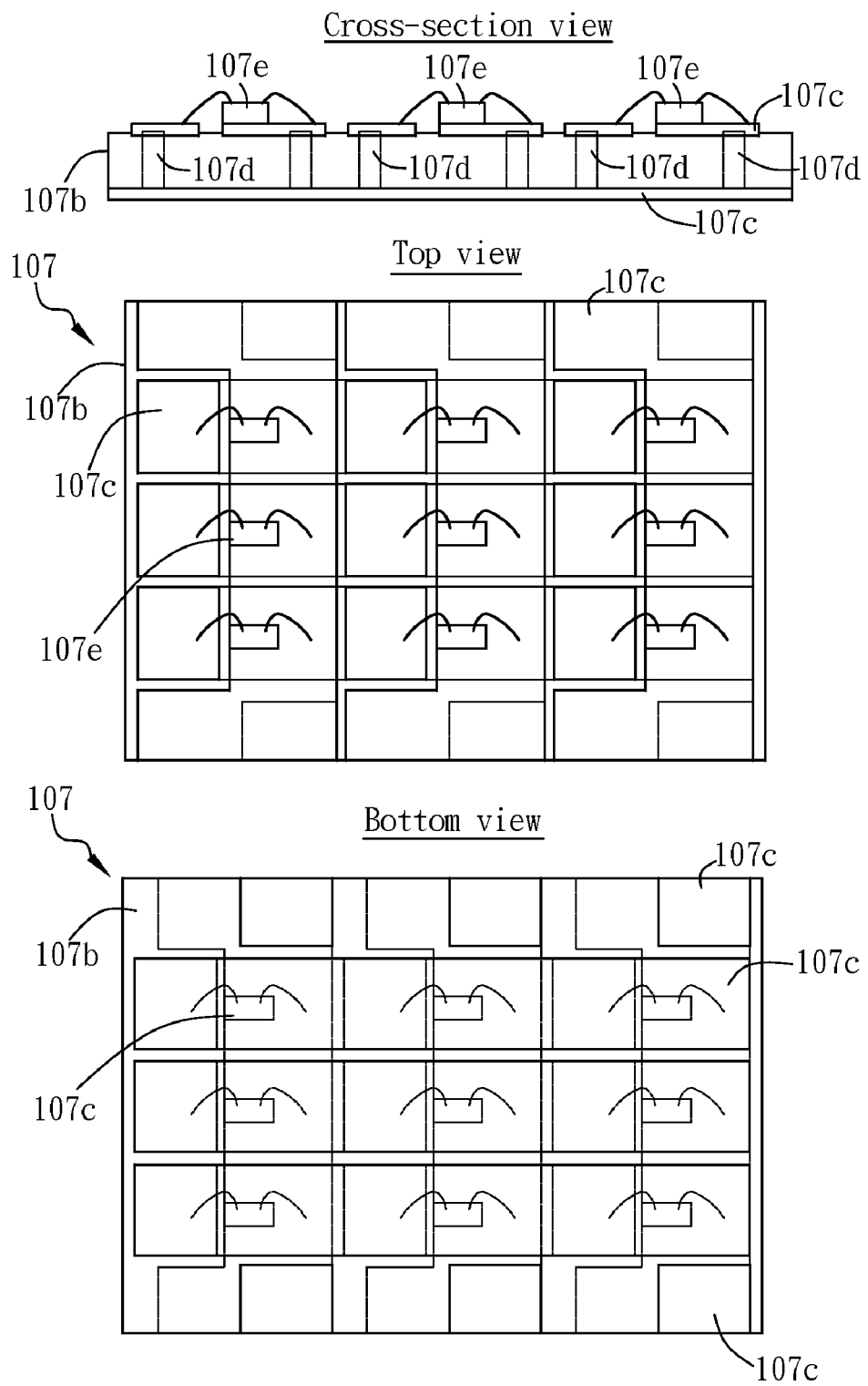
FIG. 13A to FIG. 13F are schematic views illustrating the fourth embodiment of the present invention.
Figure 13B:
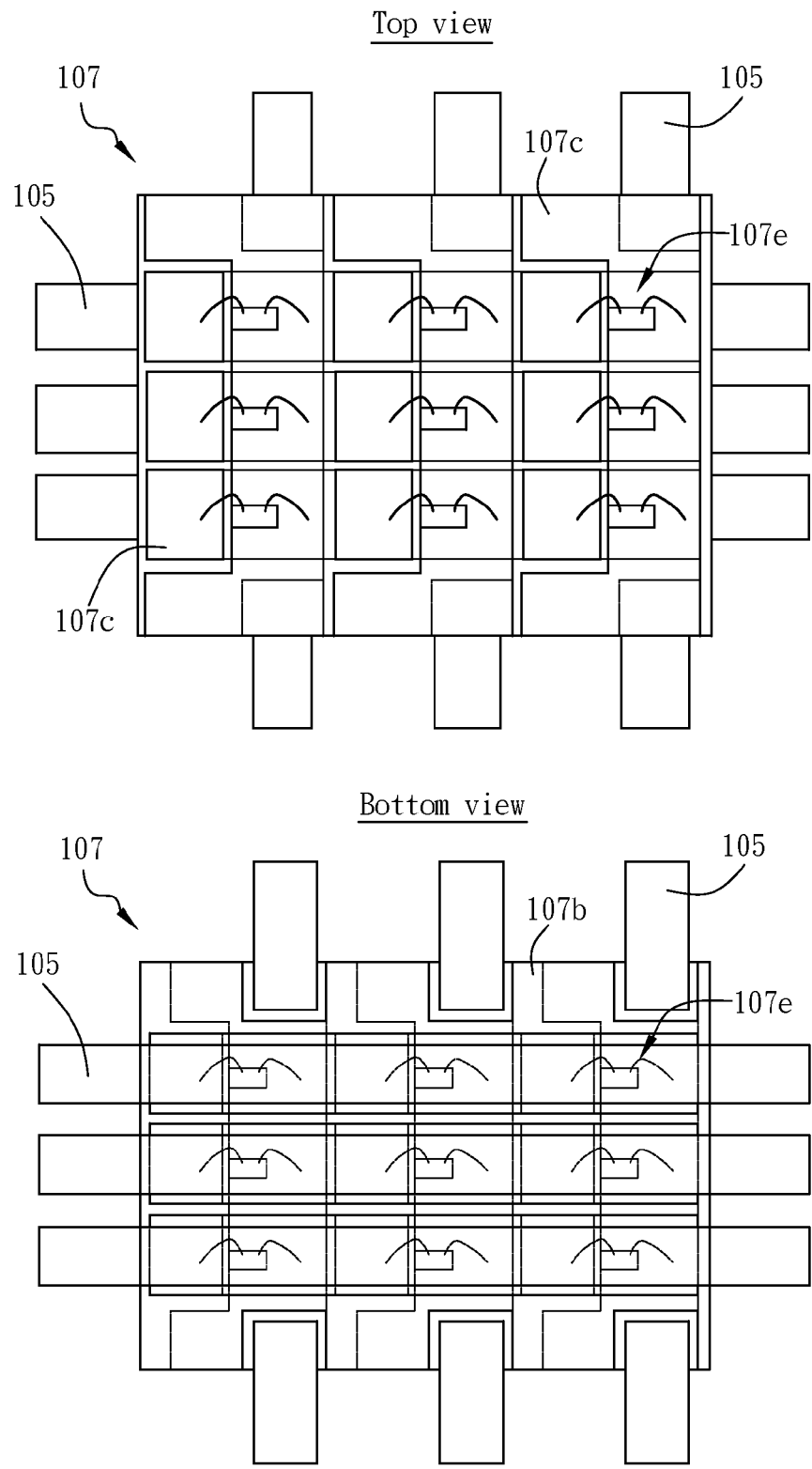
Figure 13C:
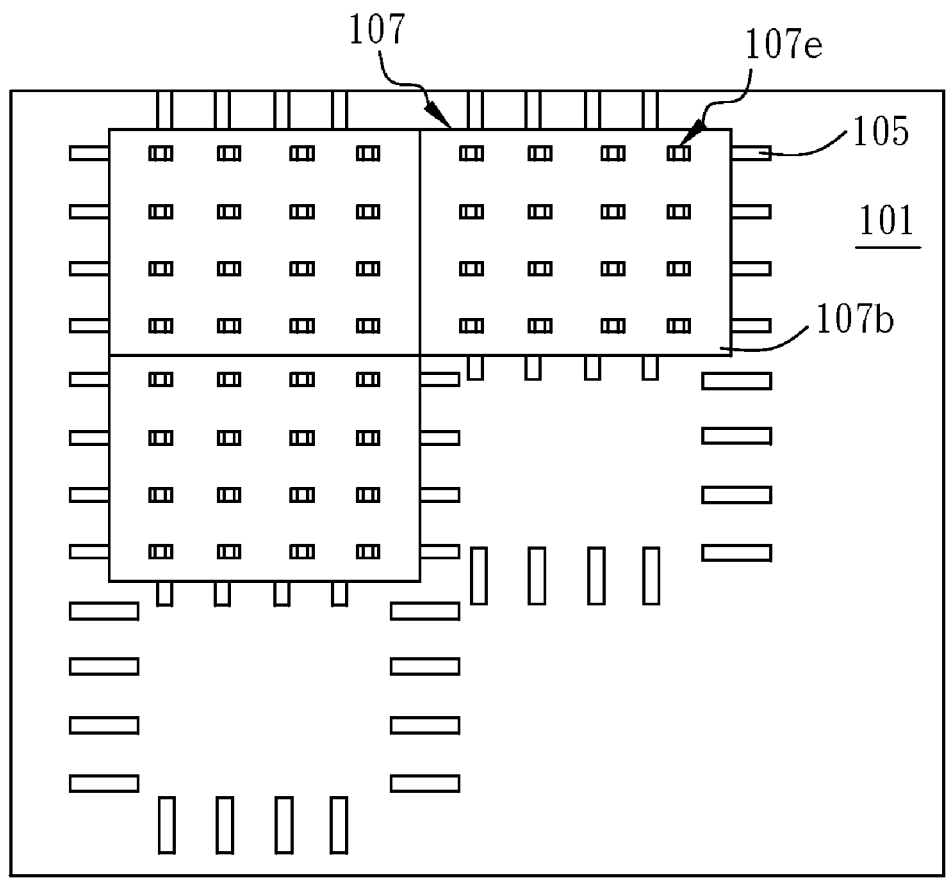
Figure 13D:
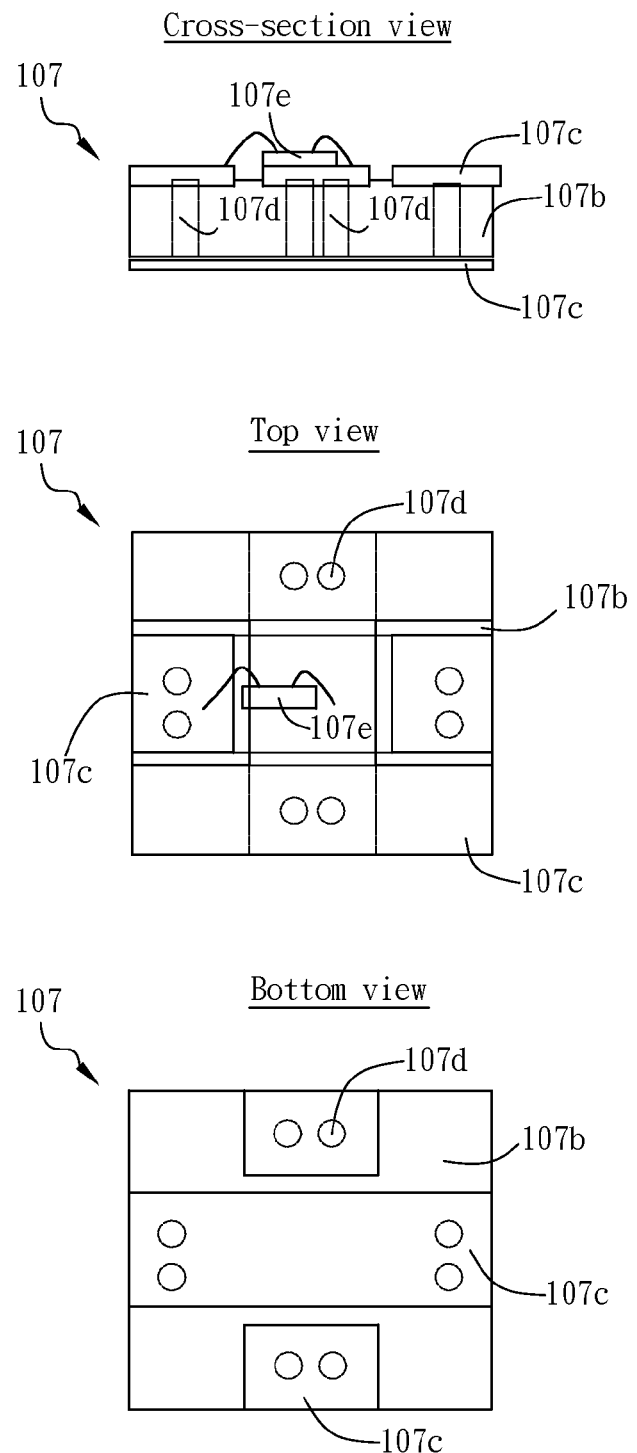
Figure 13E:
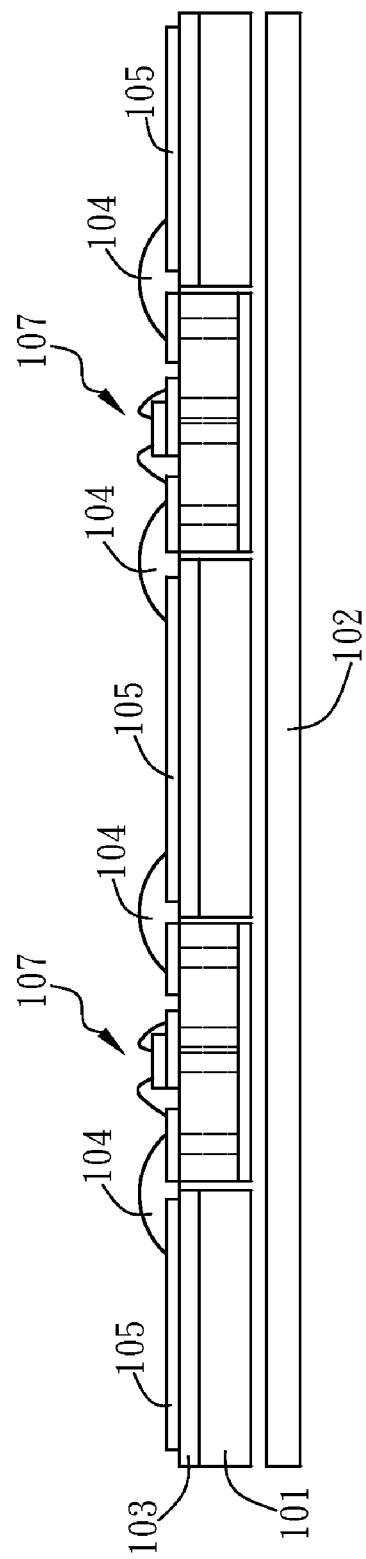
Figure 13F:
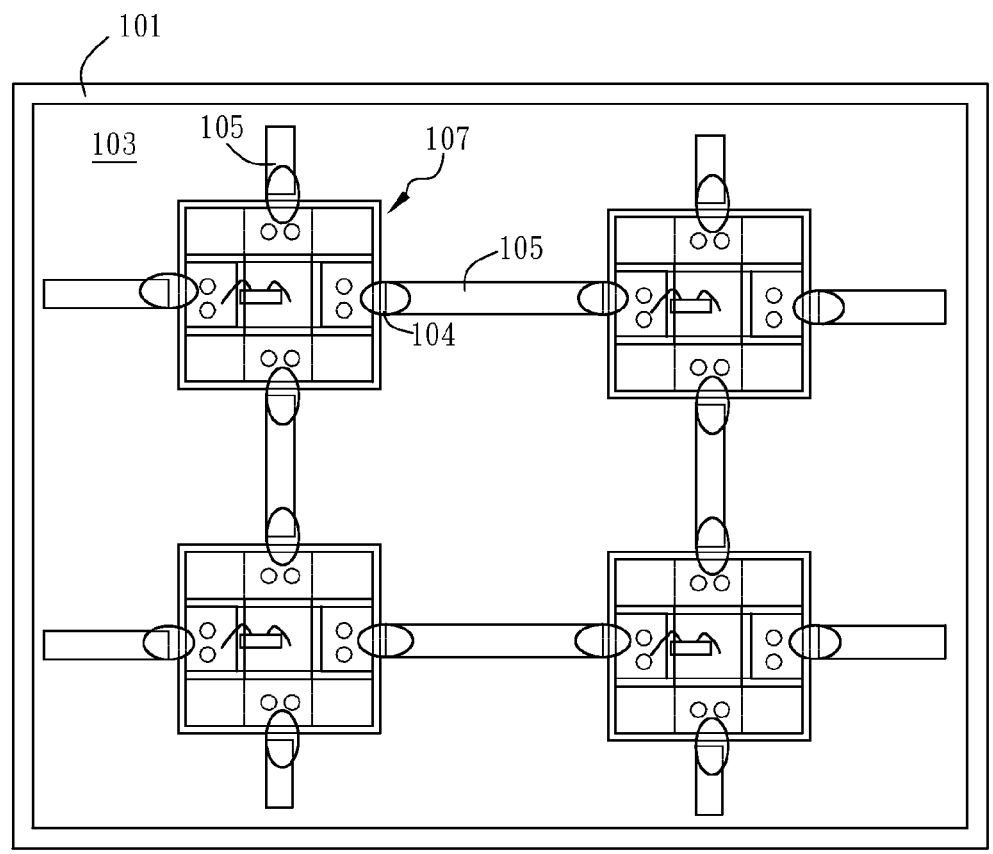

It is noted that the number of LED dice packaged onto the light source unit 107 is not limited. FIG. 13A to FIG. 13C illustrate the fourth embodiment of the present invention. In this embodiment, a plurality of LED dice 107e are bonded onto one circuit board unit 107b to form one light source unit 107. The metal layers 107c are purposely designed for electrically connecting with the patterned electrode layer 105, as shown in FIG. 13B. The patterned electrode layer 105 is also designed to create X-Y passive matrix driving. Thus, the LED dice 107e can be independently controlled via the electrode layer 105. Certainly, a plurality of light source units 107 can be further assembled onto the substrate 101 and connected with the electrode layer 105, as shown in FIG. 13C. Alternatively, as shown in FIGS. 13D to 13F, the electrical connection between the light source units 107 and the electrode layer 105 can also be formed by creating holes or recesses on the substrate 101, where the size and shape of the holes are made to accommodate the size and shape of the light source unit 107. The thickness of the substrate 101 can be selected to match the thickness of the circuit board 107a, so that the light source unit 107 will fall into the hole tightly, where the top metal layer 107c is at the same plane as the electrode layer 105. The electrical connection between the top metal layer 107c of the light source unit 107 and the electrode layer 105 can be formed by applying any type of conductive glue 104. It is noted that the conductive glue can also be replaced by a conductive tape or by applying a soldering between the top metal layer 107c and the electrode layer 105. FIG. 13D shows the circuit board unit 107b layout of the light source unit 107, and FIG. 13E and FIG. 13F show schematic structure of the light source units 107 after assembled on the substrate 101. To prevent the light source units 107 fall out of the substrate 101, a supporting sheet 102 can be disposed underneath of the substrate 101.

Figure 14A:
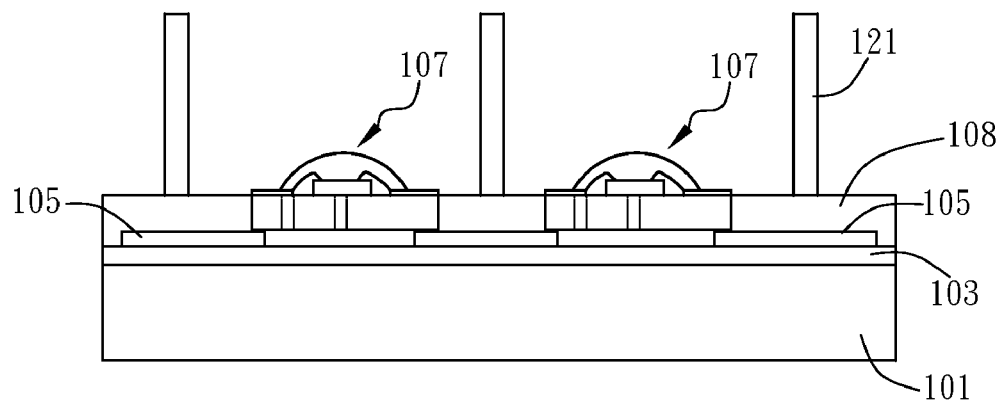
FIG. 14A and FIG. 14B are schematic views illustrating the fifth embodiment of the present invention.
Figure 14B:
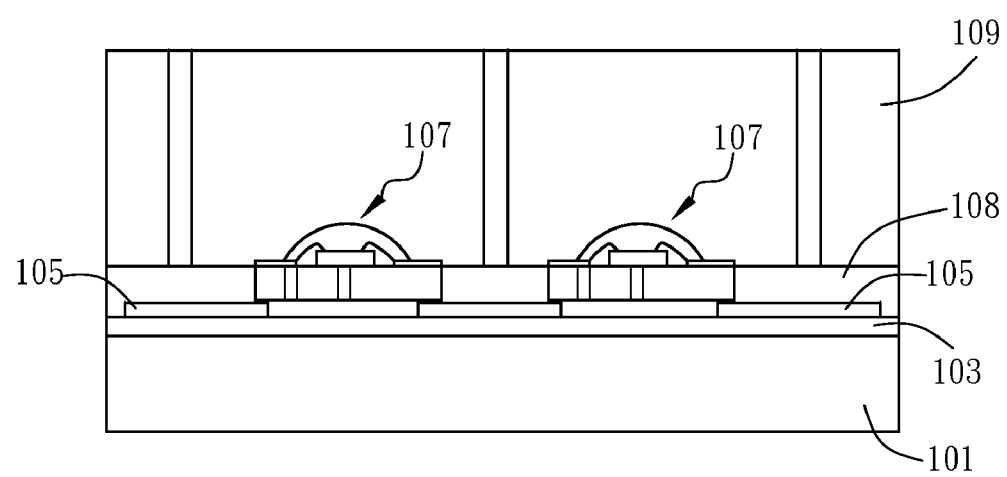

The fifth embodiment discloses a lighting device 1 formed with partitions between the light source units 107. As shown in FIG. 14A and FIG. 14B, a plurality of isolation grid structures 121 is formed within the transparent layer 109 to partition the plurality of light source units 107. The isolation grid structures 121 can be formed by screen printing, inkjet printing, stamping, or any other direct pattern-printing processes in advance and the transparent layer 109 be coated subsequently. Alternatively, the transparent layer 109 can be formed in advance and the isolation grid structures 121 being planted into the transparent layer 109 which can be made by any conventional molding process or knife punching method. It is noted that the materials of isolation grid structures 121 is not limited and is preferred to be white and non-transparent or semi-transparent, so as to block the light from the adjacent light source units 107. The lighting device 1 of this embodiment is to provide each individual light source unit 107 being turned on or off without being interfered by any adjacent units, and therefore, a turned-on light source unit with a sharp pixel image can be achieved. More specifically, by controlling the light source units 107 turning on and off, the lighting device 1 is adapted to present an image with a well defined shape (ex, a square shape as illustration in this invention).

Figure 15A:
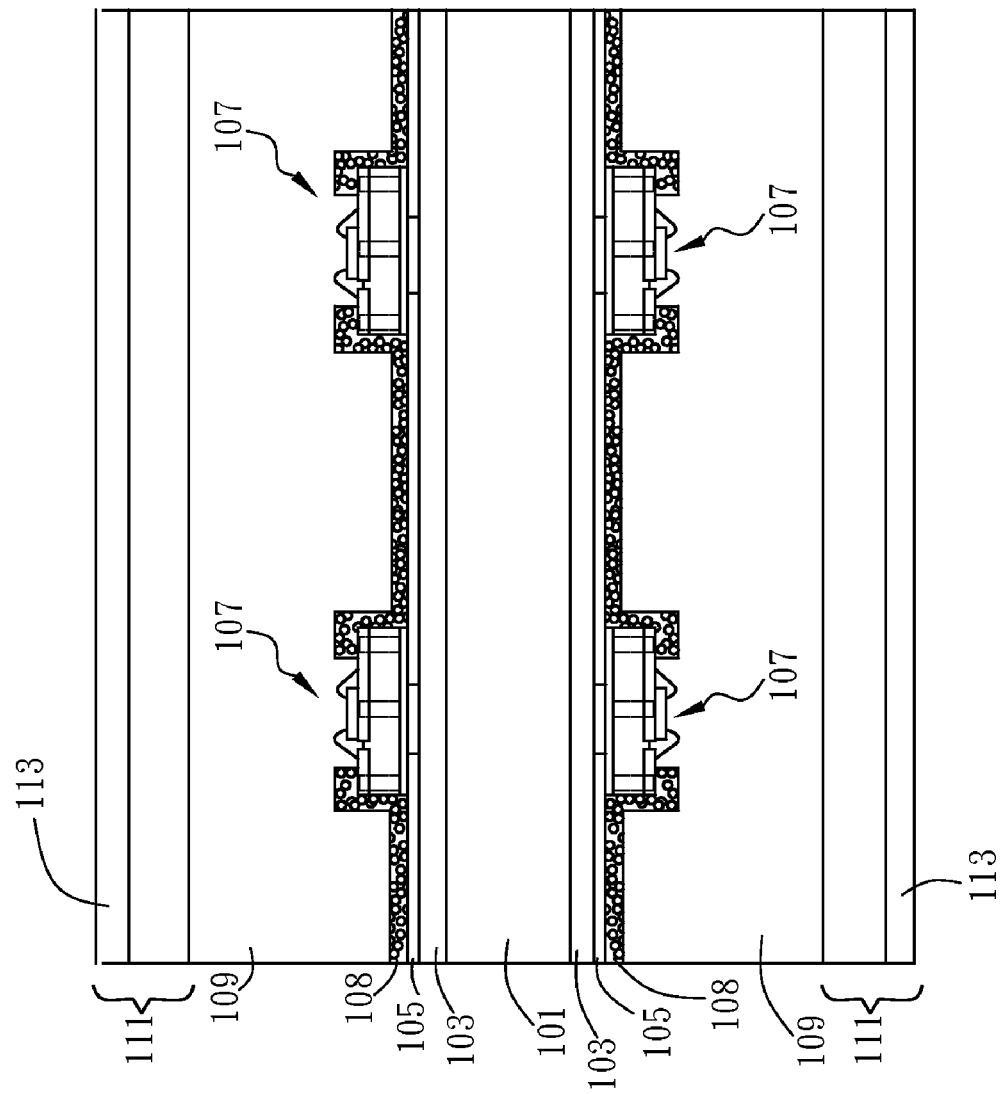
FIG. 15A and FIG. 15B are schematic views illustrating the sixth embodiment of the present invention.
Figure 15B:
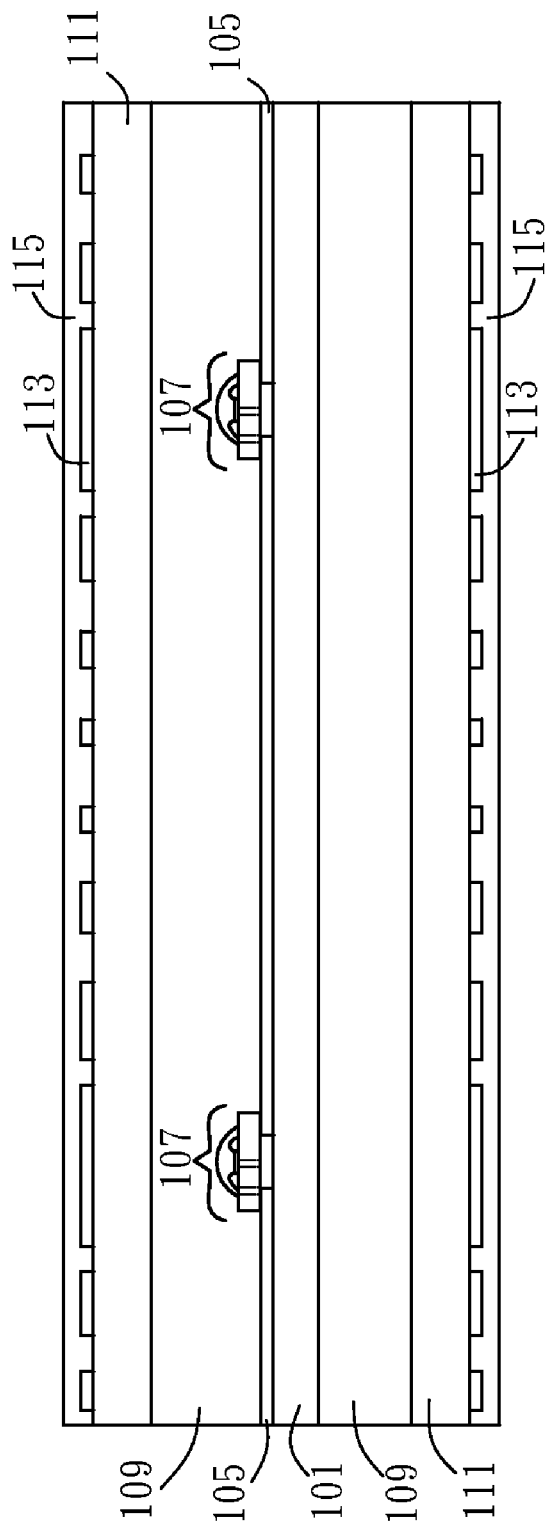

The sixth embodiment of the present invention relates to a double-side backlight module. As shown in FIG. 15A, another lighting device as described above can be duplicated onto the other side of the substrate 101 using the same manufacturing process as described above. Therefore, back-to-back lighting devices sharing the same substrate 101 are obtained. It is noted that the substrate 101 is preferably made of a metal plate or a metal sheet, which provide good heat dissipation. Alternatively, as shown in FIG. 15B, in case of the substrate 101 being transparent, another similar backlight module can be assembled in a back-to-back manner even though only one set of light source units 107 is provided. Light emitted from the light source units 107 would be reflected and would travel within the backlight module. Two opposite uniform illumination would be obtained.

Figure 16A:
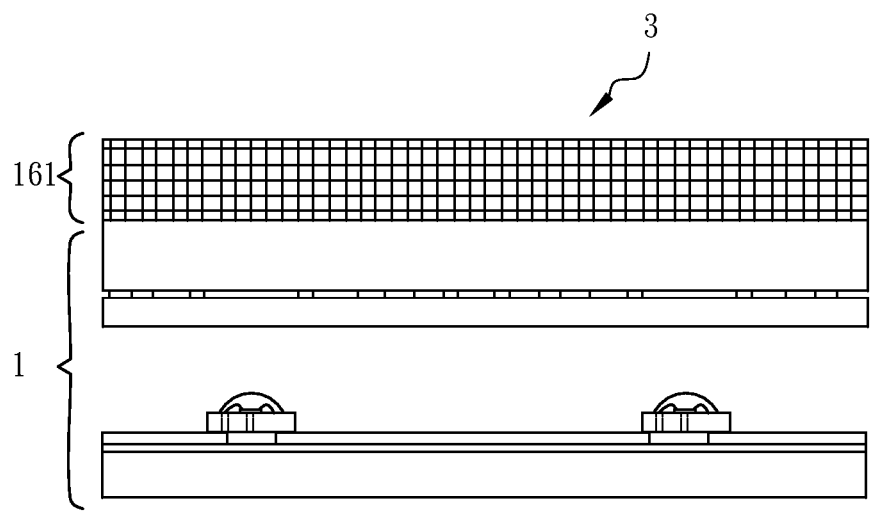
FIG. 16A to FIG. 16D are schematic view illustrating the display of the seventh embodiment of the present invention.
Figure 16B:
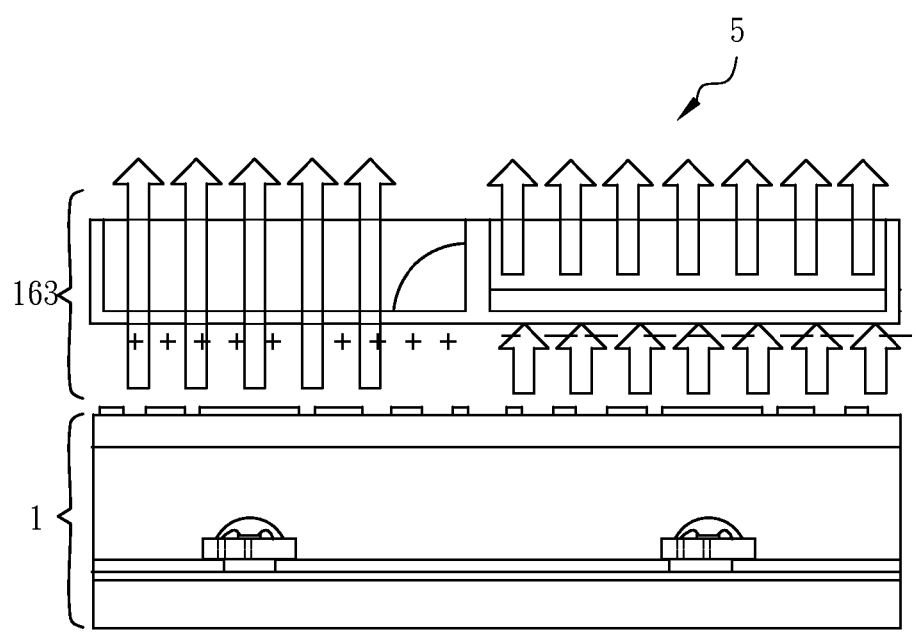

The seventh embodiment of the present invention is to provide a display 3 comprising the lighting device 1 disclosed in the aforesaid embodiments. The display 3 further comprises a panel which is stacked onto the lighting device 1. Referring to FIG. 16A, the panel is a liquid crystal panel 161 for displaying an image. Referring to FIG. 16B, the panel is an electrowetting panel 163, in which oil drops containing phosphor particles are disposed. The electrowetting panel 163 is stacked onto the lighting device 1 to form an electrowetting panel display (EWD) 5. By applying a voltage onto the electrowetting panel, the oil drops are controlled to be concentrated or spread. It would be imagined that at least two different colors could be selectively emitted from the lighting device 1 with only one type of light source.

Figure 16C:
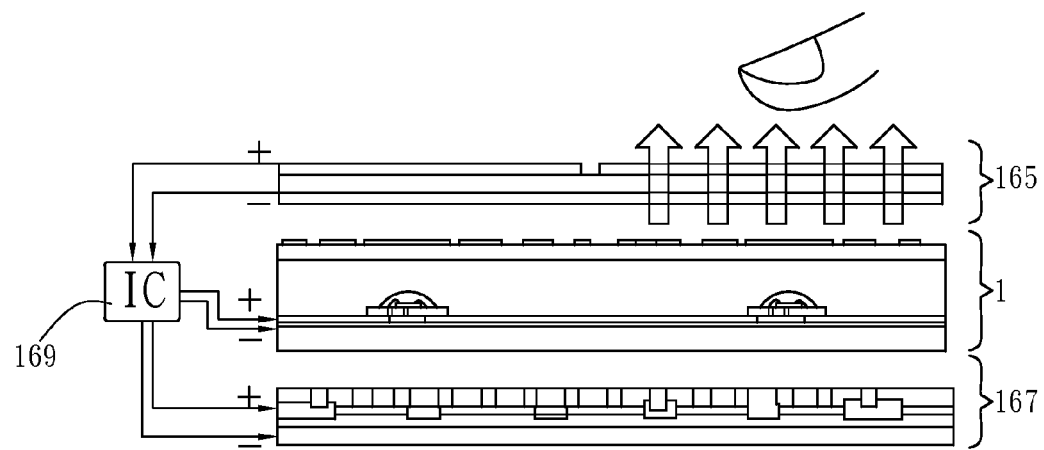
Figure 16D:
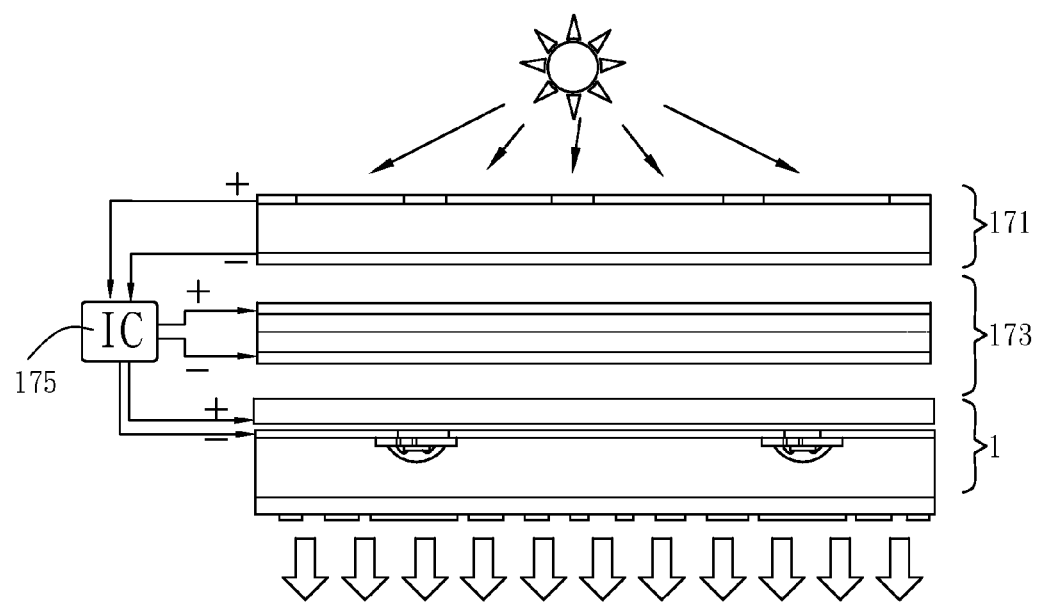

Referring to FIG. 16C, the panel is a touch panel 165 which is electrically connected to a control IC 169. Another electric device, for example, a thin speaker 167, could be also applied in this embodiment. Referring to FIG. 16D, the panel is a solar panel 171 which is electrically connected to a control IC 175. A battery 173 to storage electrical power and to provide the electrical power for the lighting device 1 is further provided.

Given the above, the direct-type lighting device suitable for large-scale product application is disclosed in the present invention. The lighting device is able to produce an uniform surface light within an ultra thin format and is able to selectively control the LED dice through the electrode layer thus to provide local dimming features.

The above disclosure is related to the detailed technical contents and inventive features thereof. People skilled in this field may proceed with a variety of modifications and replacements based on the disclosures and suggestions of the invention as described without departing from the characteristics thereof. Nevertheless, although such modifications and replacements are not fully disclosed in the above descriptions, they have substantially been covered in the following claims as appended.

What is claimed is:

1. A lighting device, comprising:
    a substrate;
    an electrode layer patterned on the substrate;
    a plurality of light source units being arranged onto the substrate to electrically connect with the electrode layer and to form an array, each of the light source units having opposite contacts electrically connected to the same electrode layer;
    a light scattering layer covering the substrate and the electrode layer;
    a transparent layer overlaying the light scattering layer and the light source units to cover an entire area above the light scattering layer and the light source units; and
    a reflector disposed on the transparent layer, wherein the reflector has reflective patterns distributed with respect to each of the light source units and in a higher density above each of the light source units.

2. The lighting device as claimed in claim 1, further comprising a phosphor layer disposed above the reflector, wherein the phosphor layer is coated onto the reflector or coated on a transparent plastic sheet to be disposed onto the reflector.

3. The lighting device as claimed in claim 2, wherein the phosphor layer comprises light scattering particles being added therein.

4. The lighting device as claimed in claim 3, wherein the light scattering particles are selected from a group of: titanium dioxide particles, calcium carbonate particles, silica oxide particles, metallic particles, air microvoids, and a combination thereof.

5. The lighting device as claimed in claim 1, wherein each of the light source units includes a circuit board unit and at least one light emitting diode (LED) die being electrically connected to the circuit board unit.

6. The lighting device as claimed in claim 5, wherein the circuit board unit includes a top metal layer, a bottom metal layer, and via holes connecting with the top and bottom metal layers.

7. The lighting device as claimed in claim 6, wherein the at least one LED die is wire bonded or flip chip bonded to the top metal layer of the circuit board unit.

8. The lighting device as claimed in claim 7, wherein the bottom metal layer electrically connects to the electrode layer.

9. The lighting device as claimed in claim 7, wherein the substrate is formed with a plurality of recesses, each of the recesses receives one of the light source units, and the top metal layer electrically connects to the electrode layer.

10. The lighting device as claimed in claim 5, wherein the at least one LED die is selected from a group of: a red LED die, a green LED die, a blue LED die, a UV LED die due and a combination thereof.

11. The lighting device as claimed in claim 5, wherein the at least one LED die comprises three LED dice including a red LED die, a green LED die and a blue LED die.

12. The lighting device as claimed in claim 5, wherein each of the light source units further comprises an encapsulant enclosing the at least one LED die.

13. The lighting device as claimed in claim 12, wherein the encapsulant is a mixture of a transparent polymer resin and at least one phosphor material.

14. The lighting device as claimed in claim 12, wherein the encapsulant is a mixture of transparent polymer resin and light scattering particles, the light scattering particles being selected from a group of: titanium dioxide particles, calcium carbonate particles, silica oxide particles, metallic particles, air microvoids, and a combination thereof.

15. The lighting device as claimed in claim 12, wherein the encapsulant is a mixture of transparent polymer resin, at least one phosphor material and light scattering particles.

16. The lighting device as claimed in claim 1, wherein the light scattering layer is a mixture of polymer resin and light scattering particles, the light scattering particles being selected from a group of: titanium dioxide particles, calcium carbonate particles, silica oxide particles, metallic particles, air microvoids, and a combination thereof.

17. The lighting device as claimed in claim 1, further comprising an optical sheet disposed above the reflector, the optical sheet being selected from a group of: a brightness enhanced film (BEF), a diffuser film, and a combination thereof.

18. The lighting device as claimed in claim 1, further comprising a plurality of isolation grid structures being formed perpendicular to the substrate to partition the light source units.

19. The lighting device as claimed in claim 1, further comprising another electrode layer, other light source units, another electrode layer and another reflector being symmetrically disposed on the other side of the substrate.

20. A display, comprising a panel and a lighting device as claimed in claim 1, wherein the panel is stacked onto the lighting device.

21. The display as claimed in claim 20, wherein the panel is selected from a group of: an electrowetting panel, a liquid crystal panel, a touch panel, and a solar cell panel.

22. A method for manufacturing a lighting device, the method comprising the steps of:
    providing a substrate;
    forming a patterned electrode layer on the substrate;
    arranging a plurality of light source units onto the substrate to electrically connect with the electrode layer and to form an array, each of the light source units having opposite contacts electrically connected to the same electrode layer;
    coating a light scattering layer to cover the substrate and the electrode layer;
    forming a transparent layer overlaying the light scattering layer and the light source units to cover an entire area above the light scattering layer and the light source units; and
    disposing a reflector on the transparent layer, wherein the reflector has reflective patterns distributed with respect to each of the light source units and in a higher density above each of the light source units.

23. The method as claimed in claim 22, further comprising the following steps before the step of arranging the plurality of light source units:
   providing a circuit board;
   bonding a plurality of light emitting diode (LED) dice onto the circuit board; and
   cutting the circuit board to form the light source units.

24. The method as claimed in claim 22 further comprising a step:
   disposing a phosphor layer above the reflector.

* * * * *